(12) United States Patent
Schilling

(10) Patent No.: US 8,813,916 B2
(45) Date of Patent: Aug. 26, 2014

(54) UNDERGROUND ENCLOSURE SYSTEM FOR STORING COMPONENTS, CABLES, AND THE LIKE

(75) Inventor: Robert J. Schilling, Port Saint Lucie, FL (US)

(73) Assignee: Clear View Enclosures, Inc., Cupertino, CA (US)

( * ) Notice: Subject to any disclaimer, the term of this patent is extended or adjusted under 35 U.S.C. 154(b) by 954 days.

(21) Appl. No.: 12/104,239

(22) Filed: Apr. 16, 2008

(65) Prior Publication Data

US 2009/0260925 A1      Oct. 22, 2009

(51) Int. Cl.
| | | |
|---|---|---|
| *B66F 7/08* | (2006.01) | |
| *B66B 9/02* | (2006.01) | |
| *B66B 9/00* | (2006.01) | |
| *H02G 9/10* | (2006.01) | |
| *A47B 81/00* | (2006.01) | |

(52) U.S. Cl.
USPC ........... 187/269; 187/250; 187/342; 254/122; 312/22; 312/296; 312/306; 174/37

(58) Field of Classification Search
USPC ............... 187/211, 269, 273, 275, 250, 342; 254/122; 312/22, 31.1, 100, 296, 306, 312/319.8; 174/37
IPC ......... B66F 7/08; F17C 1/00,13/12; B66B 9/02
See application file for complete search history.

(56) References Cited

U.S. PATENT DOCUMENTS 2,107,210 A  *  2/1938  Palm ..................... 414/137.2
2,310,309 A       2/1943  Orr (Continued)

FOREIGN PATENT DOCUMENTS

| CH | 682961 A5 | * | 12/1993 | ............. E04H 5/04 |
| JP | 03293207 A | * | 12/1991 | ............ B65G 25/10 |
| JP | 2000034097 A | * | 2/2000 | ............... B66F 7/08 |

OTHER PUBLICATIONS

Schilling, Robert J., Venting System for an Underground Enclosure, Pending Patent Application, filed Apr. 16, 2008, U.S. Appl. No. 12/104,264.

(Continued)

*Primary Examiner* — William A Rivera
*Assistant Examiner* — Stefan Kruer
(74) *Attorney, Agent, or Firm* — Brian B. Shaw, Esq.; Timothy W. Menasco, Esq.; Harter Secrest & Emery LLP

(57) ABSTRACT

A pressurized underground enclosure includes a battery venting system having a battery within a battery box in a sealed enclosure. A first pipe is fluidly connected to the battery box and an ambient atmosphere and includes a vacuum generator for reducing a pressure in the battery box. A second pipe is fluidly connected to the battery box and the ambient atmosphere and includes a one-way valve permitting airflow to the battery box and precluding airflow from the battery box to the ambient atmosphere. The enclosure includes a scissors lift including scissor linkage units having arms pivotally connected at terminal ends and at central positions. The scissor linkage units are moveable from a retracted to an extended position by pneumatic cylinders. The internal pressurization of the enclosure is selectively released and locking mechanisms are retracted before a rack of the scissors lift is extended through an opening of the enclosure.

15 Claims, 18 Drawing Sheets

(56) References Cited

U.S. PATENT DOCUMENTS

| | | | |
|---|---|---|---|
| 2,843,349 A | 7/1958 | Meyer | |
| 3,350,065 A * | 10/1967 | Mankey | 254/122 |
| 3,984,942 A | 10/1976 | Schroth | |
| 4,088,203 A * | 5/1978 | Smith, Jr. | 182/141 |
| 4,261,079 A * | 4/1981 | Masini et al. | 19/159 R |
| 4,363,380 A | 12/1982 | Rued et al. | |
| 4,375,104 A | 2/1983 | Starr et al. | |
| 4,683,988 A | 8/1987 | Shrum, Jr. | |
| 4,747,242 A * | 5/1988 | Aarstad | 52/174 |
| 4,786,032 A * | 11/1988 | Garman et al. | 254/93 HP |
| 5,085,293 A * | 2/1992 | Aime | 187/400 |
| 5,189,723 A | 2/1993 | Johnson et al. | |
| 5,216,577 A | 6/1993 | Schilling | |
| 5,476,050 A * | 12/1995 | Zimmer et al. | 108/145 |
| 5,636,711 A * | 6/1997 | Nussbaum | 187/211 |
| 5,934,414 A * | 8/1999 | Staczek | 187/269 |
| 5,993,146 A * | 11/1999 | Hallgren | 414/792.2 |
| 6,031,180 A | 2/2000 | Schilling et al. | |
| 6,116,616 A * | 9/2000 | Bratten | 277/646 |
| 6,182,796 B1 * | 2/2001 | Perlstein et al. | 187/208 |
| 6,296,006 B1 | 10/2001 | Wegner | |
| 6,362,419 B1 * | 3/2002 | Gallagher et al. | 174/37 |
| 6,593,525 B1 * | 7/2003 | Vanderhoof et al. | 174/50 |
| 6,783,198 B2 * | 8/2004 | Rudd et al. | 312/319.8 |
| 6,861,584 B2 * | 3/2005 | Hutchin et al. | 174/50 |
| 6,883,641 B2 * | 4/2005 | Julien | 182/69.1 |
| 7,033,066 B2 | 4/2006 | Helder | |
| 7,178,810 B1 | 2/2007 | Kuhary | |
| 7,330,625 B2 | 2/2008 | Barth | |
| 7,333,320 B2 | 2/2008 | Standish et al. | |
| 7,645,105 B2 | 1/2010 | Hengel et al. | |
| 2003/0213653 A1 * | 11/2003 | Morris | 187/269 |
| 2006/0021784 A1 * | 2/2006 | Garmong | 174/100 |
| 2006/0180403 A1 * | 8/2006 | Hanlon | 187/269 |
| 2009/0020304 A1 * | 1/2009 | Balfour, Jr. | 174/37 |
| 2009/0309309 A1 * | 12/2009 | Schilling | 277/312 |

OTHER PUBLICATIONS

Schilling, Robert J., Retention System for an Inflatable Seal, Pending Patent Application, filed Jun. 12, 2008, U.S. Appl. No. 12/138,148.

* cited by examiner

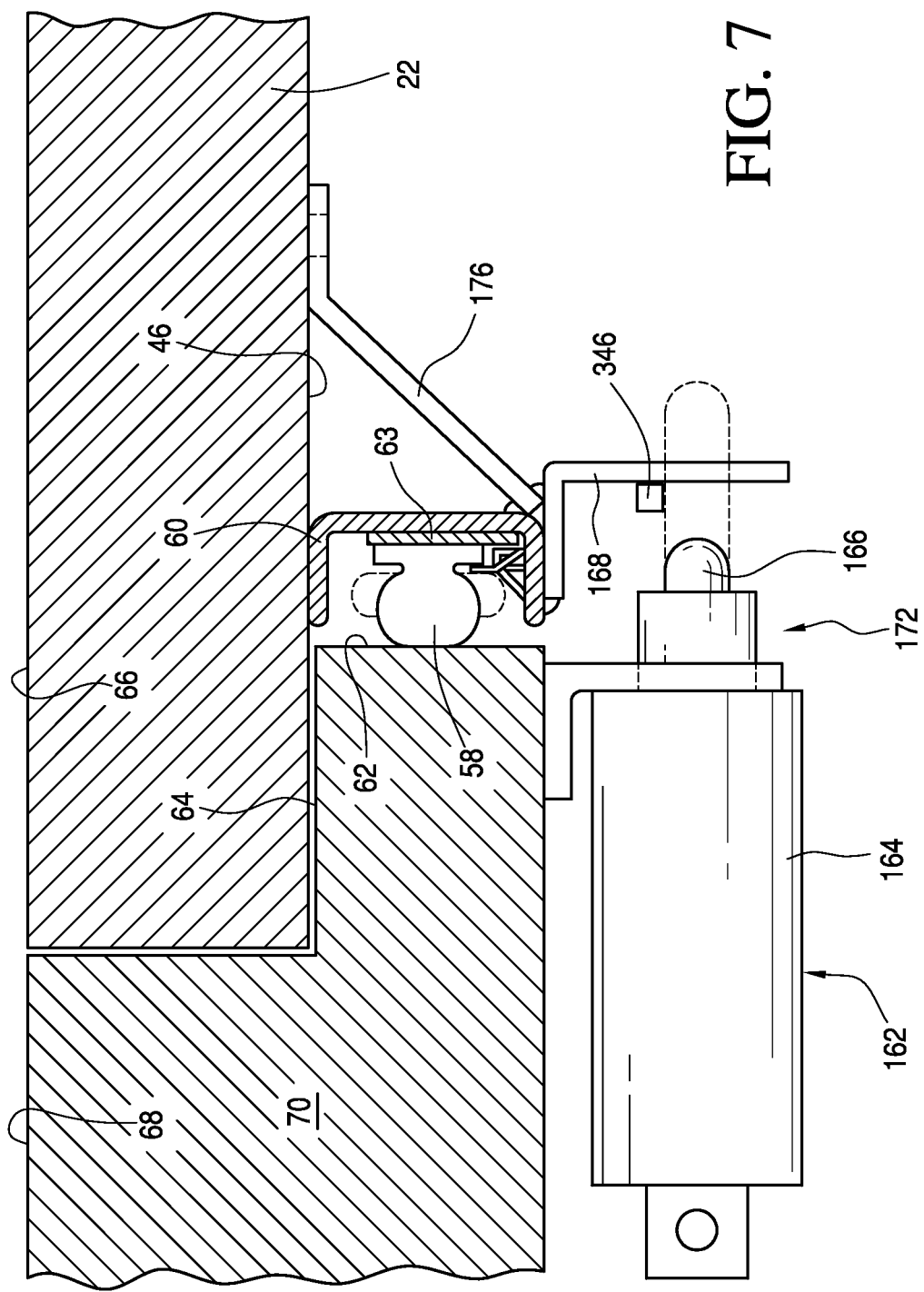

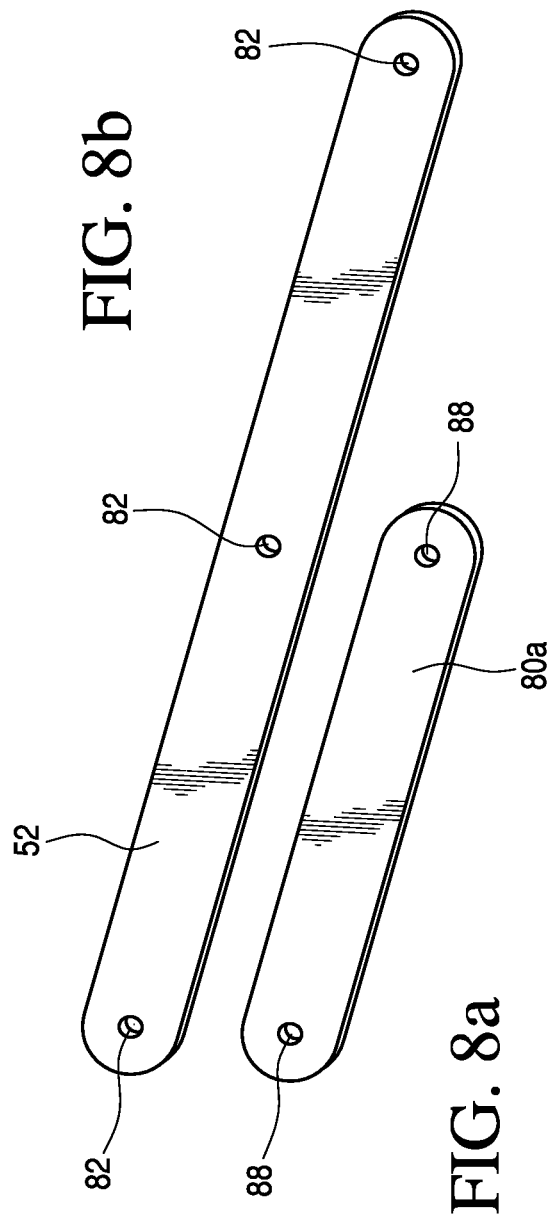

UNDERGROUND ENCLOSURE SYSTEM FOR STORING COMPONENTS, CABLES, AND THE LIKE

CROSS-REFERENCE TO RELATED APPLICATIONS

None.

STATEMENT REGARDING FEDERALLY SPONSORED RESEARCH OR DEVELOPMENT

None.

REFERENCE TO A "SEQUENCE LISTING"

None.

TECHNICAL FIELD

The present invention relates to an underground enclosure system, and more particularly, to an underground enclosure for housing cables and equipment in a pressurized environment.

BACKGROUND OF THE INVENTION

A number of devices have been employed to secure cables and electronic equipment underground for selective access. As the number of systems being disposed underground increases, there is an increasing need for subterranean enclosures that can accommodate a variety of cable and electronic equipment systems, under a variety of soil and environmental conditions. Further, as these devices are employed more frequently, the number of devices that are retained within the enclosure increases. These components have a substantial weight, which inhibits operator manipulation of the components. In addition, the cables themselves have a weight and rigidity that inhibit effective manipulation and access to the cables. Further, space constraints inhibit workers from easily accessing the cables and components for maintenance and repairs.

The variety of systems being disposed underground increases the variety of components and cables that must be accommodated. That is, some systems such as traffic control devices generate a significant quantity of heat that must be dissipated from the components. Chargeable batteries within underground enclosures generate an accumulation of Hydrogen gas ($H_2$) causing some enclosures to explode. Fiber optic systems employ components that must be securely protected from the environment. Internal pressurization must be released systematically before the components and cables are accessed. However, there is no single system that can accommodate the variety of cable and electronic equipment systems that may be employed underground.

Therefore, a need exists for a below ground environment that is sealable from the surrounding ambient atmosphere and terrain. The need further exists for such an enclosure to offer enhanced resistance to environmental penetration. It is anticipated that maintenance rather than repairs will reduce the down time of any cable and electronic equipment system passing through the enclosure, and therefore, the need also exists for an enclosure that can readily present the components from the underground position to provide access to the components as well as the interior of the enclosure. A need also exists for a battery venting system that can reduce an accumulation of gas discharged from a battery within the enclosure, and thus reduce associated risks. Further, an underground enclosure opening sequence is needed to properly dissipate the pressure within the enclosure before the enclosure is opened.

SUMMARY OF THE INVENTION

The present invention generally includes a battery venting system for an underground enclosure system. The battery venting system includes a battery box disposed within a sealed underground enclosure and a chargeable battery within the battery box. A first pipe includes a first end fluidly connected to the battery box and a second end exposed to an ambient atmosphere. A vacuum generator, such as a fan, is fluidly connected to the first pipe for reducing a pressure in the battery box. The vacuum generator exhausts through the second end of the first pipe into the ambient atmosphere. The underground enclosure system further includes a second pipe having a first end fluidly connected to the battery box and a second end exposed to the ambient atmosphere, wherein a one-way valve within the second pipe permits flow from the second end to the first end of the second pipe into the battery box and precludes flow from the second end of the second pipe to the ambient atmosphere.

The present invention also provides a scissors lift assembly for an underground enclosure system having a scissors lift sized to be received through an upper opening of an underground enclosure. The scissors lift includes a plurality of scissor linkage units, each scissor linkage unit having pivotally interconnected arms at a central position and terminal ends pivotally coupling one of the scissor linkage units to another one of the scissor linkage units. At least two plates are slideably coupled to a track disposed at a bottom of the scissors lift, wherein one of the plurality of scissor linkage units is pivotally mounted to the at least two plates. A scissors lift piston having a first end coupled to one of the scissor linkage units and a second end coupled to another one of the scissor linkage units translates the scissor linkage units between a retracted position and an extended position.

The present invention further includes a method of operating a pressurized underground enclosure by stopping an internal pressurization from a pressurized gas source within an interior of an enclosure housing and venting the pressurized gas out of the interior of the housing. A pneumatic seal assembly intermediate a cover disposed within a collar of the enclosure housing is deflated and, locking assemblies are retracted from the cover of the enclosure housing.

The invention will now be described in detail in terms of the drawings and the description which follow.

BRIEF DESCRIPTION OF THE DRAWING FIGURES

FIG. 7 is a view showing a locking mechanism of the present invention.

FIG. 8a is a perspective view of a short arm of a scissor linkage unit.

FIG. 8b is a perspective view of a long arm of the scissor linkage unit.

DETAILED DESCRIPTION OF THE INVENTION

At the outset, it should be appreciated that the use of the same reference number throughout the several figures designates a like or similar element.

Figure 1:
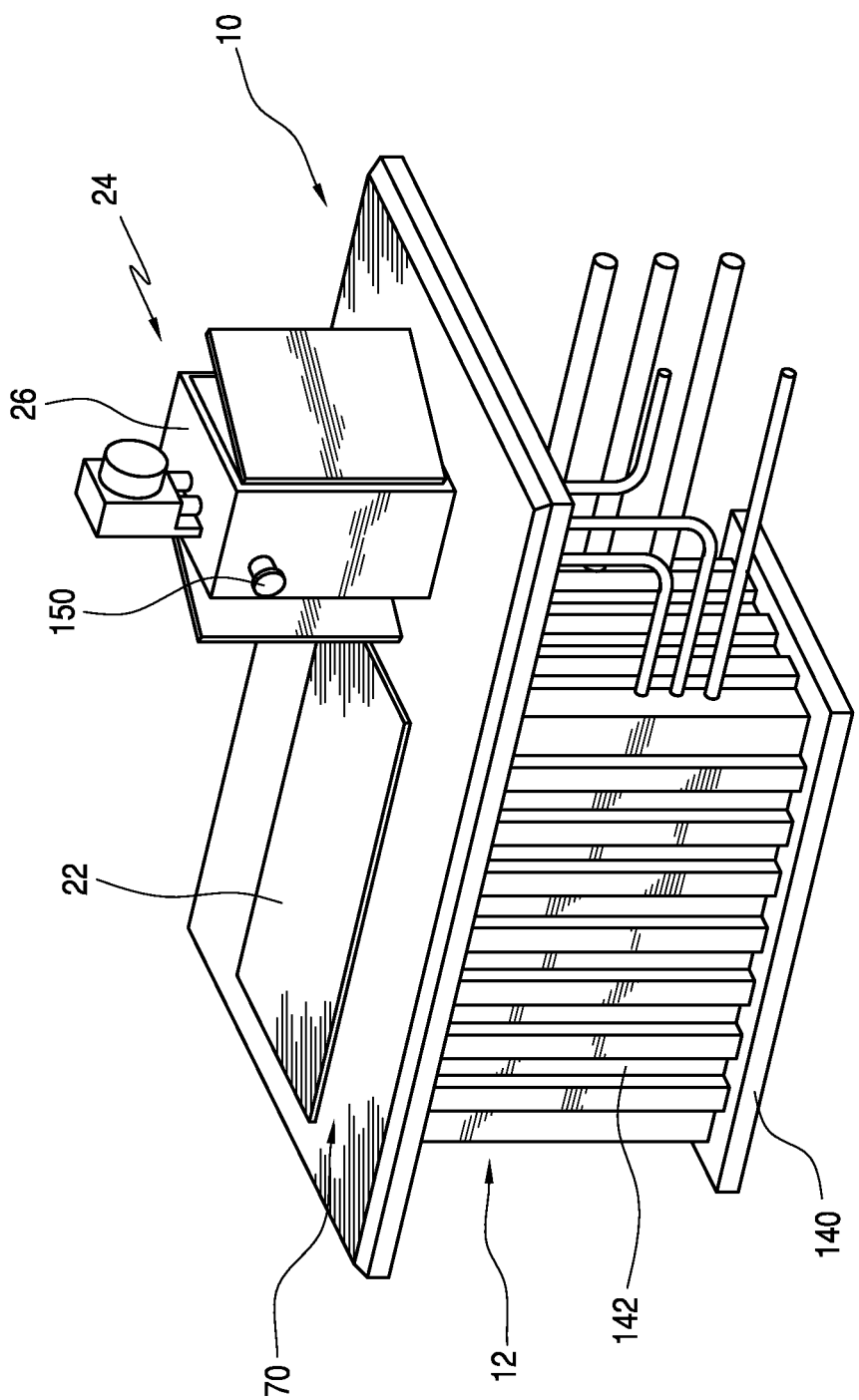
FIG. 1 is a perspective view of a sealed underground enclosure housing.
Figure 2:
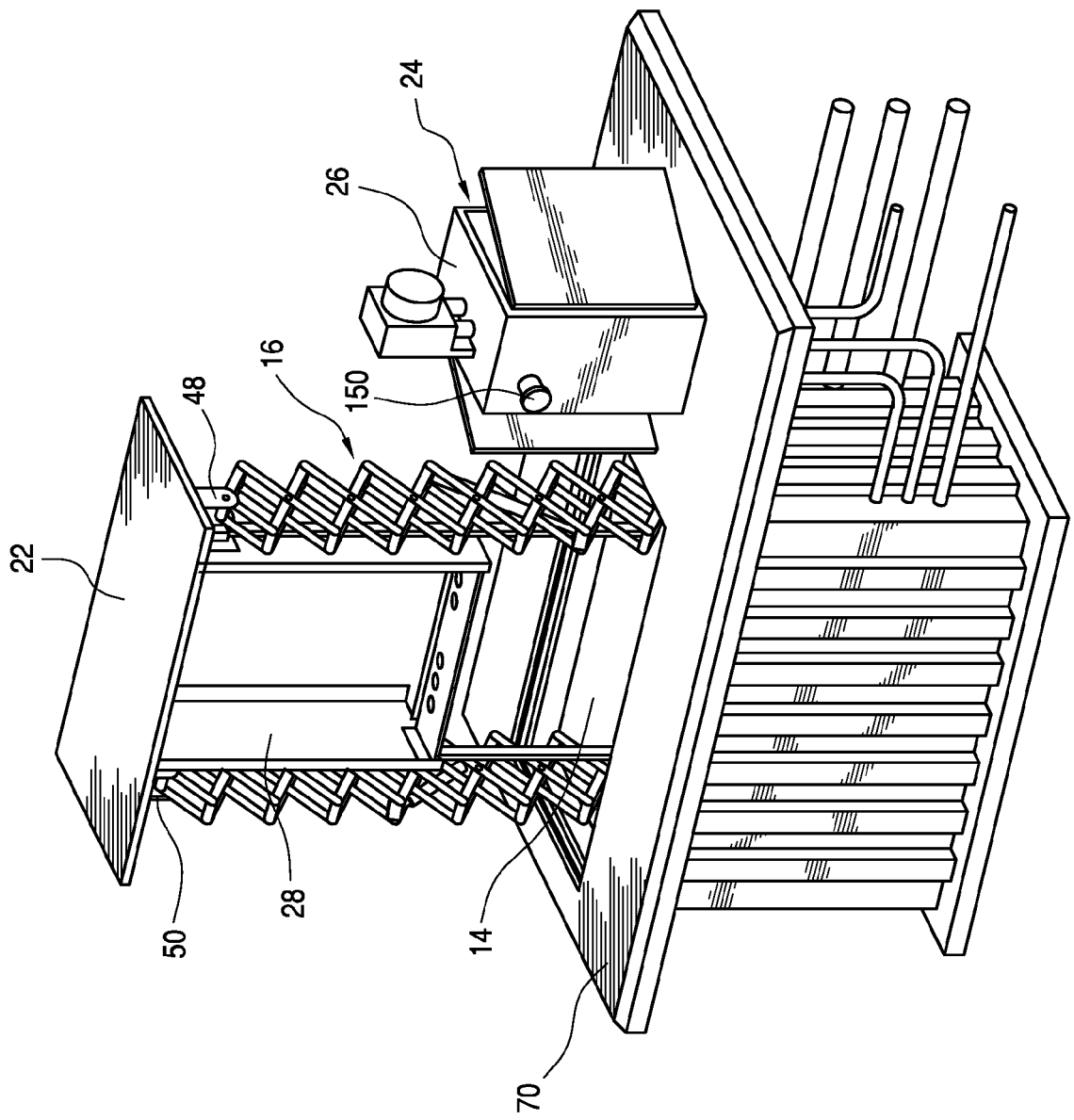
FIG. 2 is a perspective view of an unsealed, opened underground enclosure housing.

Referring now to the figures, FIGS. 1 and 2 show an underground enclosure 10 of the present invention, including a housing 12 defining an interior region 14 to enclose a scissors lift assembly 16, a battery box 18 containing a chargeable battery 20, a cover 22, and a control box 24 within a control housing 26. The underground enclosure 10 further includes a pneumatic system including a pressurized gas source 152 which is employed to pressurize and maintain the pressure in the interior region 14 of the underground enclosure 10, to inflate and maintain the pressure in a pneumatic seal 58 on the cover 22, and to actuate the locking assemblies 162. An external pressure source, such as an air compressor found on most utility trucks, assists in the movement of the scissors lift assembly 16. The scissors lift assembly 16 moves vertically, extending a rack 28 and the cover 22 above the housing 12.

Figure 4:
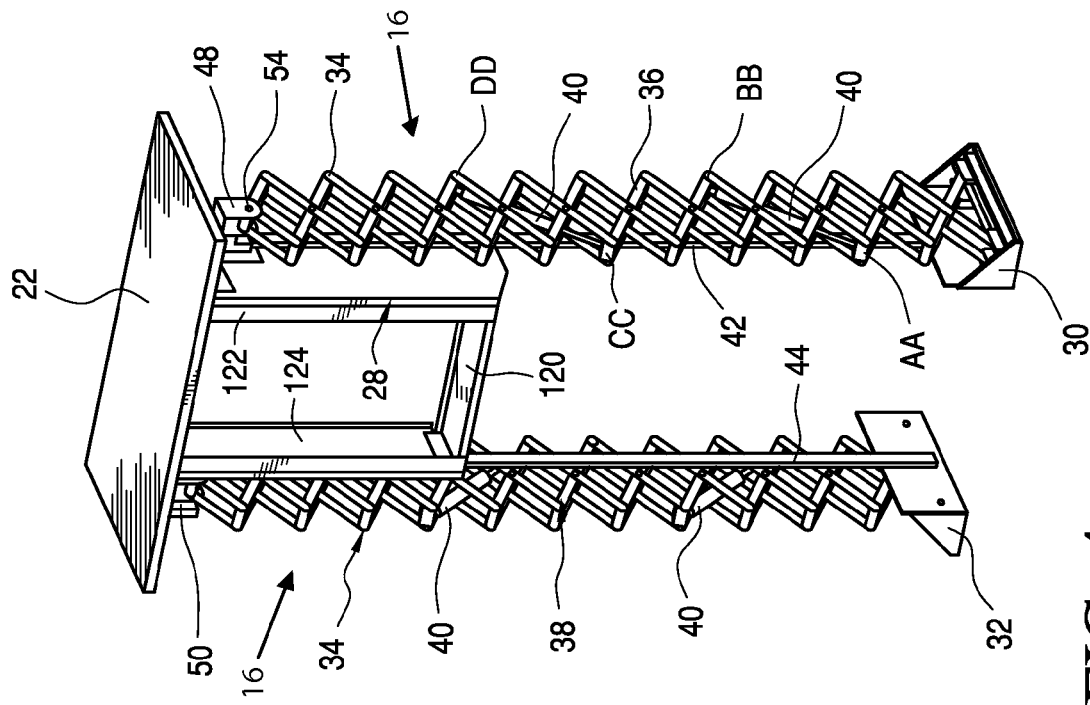
FIG. 4 is a perspective view of a scissors lift assembly in an expanded position, showing the cover secured to upper support brackets.
Figure 3:
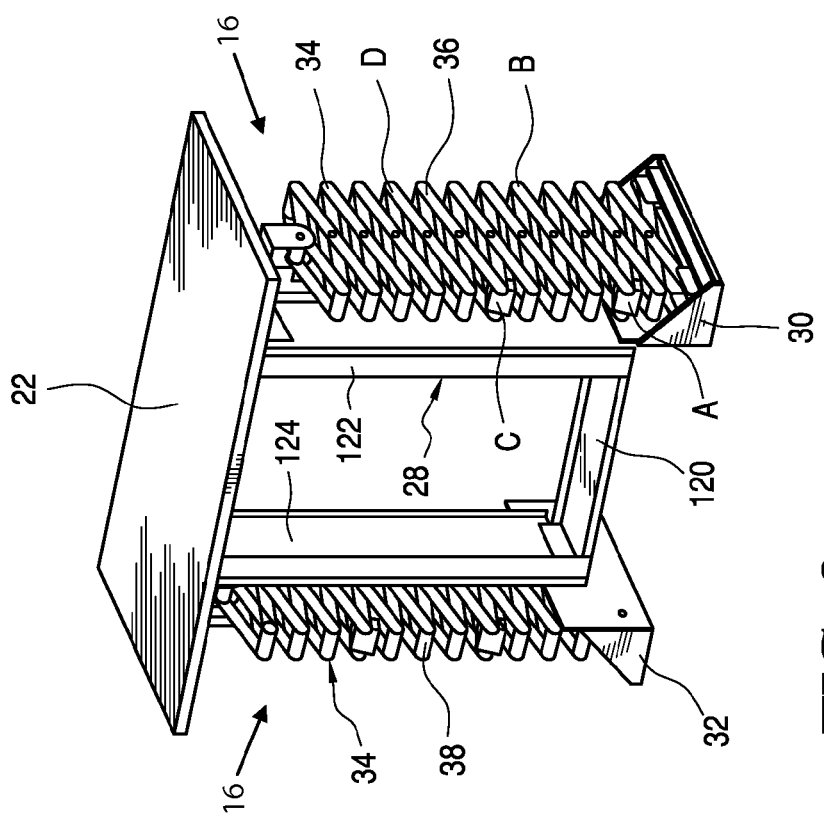
FIG. 3 is a perspective view of a scissors lift assembly in a retained position, showing a cover secured to upper support brackets.

As shown in FIGS. 3 and 4, the scissors lift assembly 16 includes two base weldments 30, 32 arranged to receive sets of scissor linkage units 34 forming a pair of vertically extendible columns 36, 38 controllable and vertically translated by pneumatic cylinder assemblies 40, and a top panel 118 of the rack 28 mounted to the cover 22. The pneumatic cylinder assemblies 40 are sometimes referred to herein as scissors lift moving pistons. Secured to an inner surface of the base weldments 30, 32 are telescoping guide tracks 42, 44 that slidably elongate as the scissors lift assembly 16 extends to an expanded position, disposed to guide the rack 28 as it is vertically translated. The telescoping guide tracks 42, 44 are preferably fabricated from stainless steal.

Figure 5:
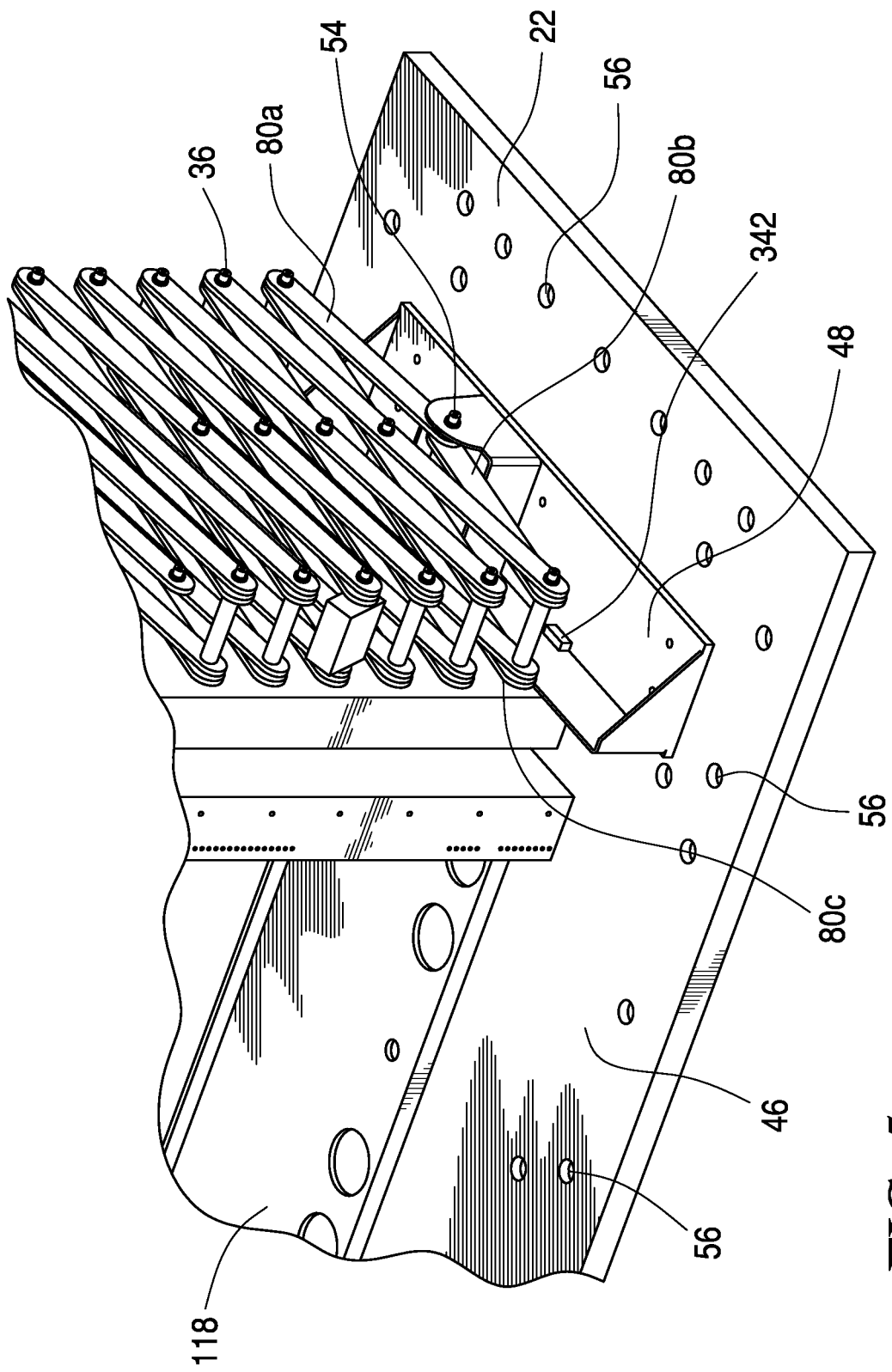
FIG. 5 is a top view of the underneath side of the cover.
Figure 6:
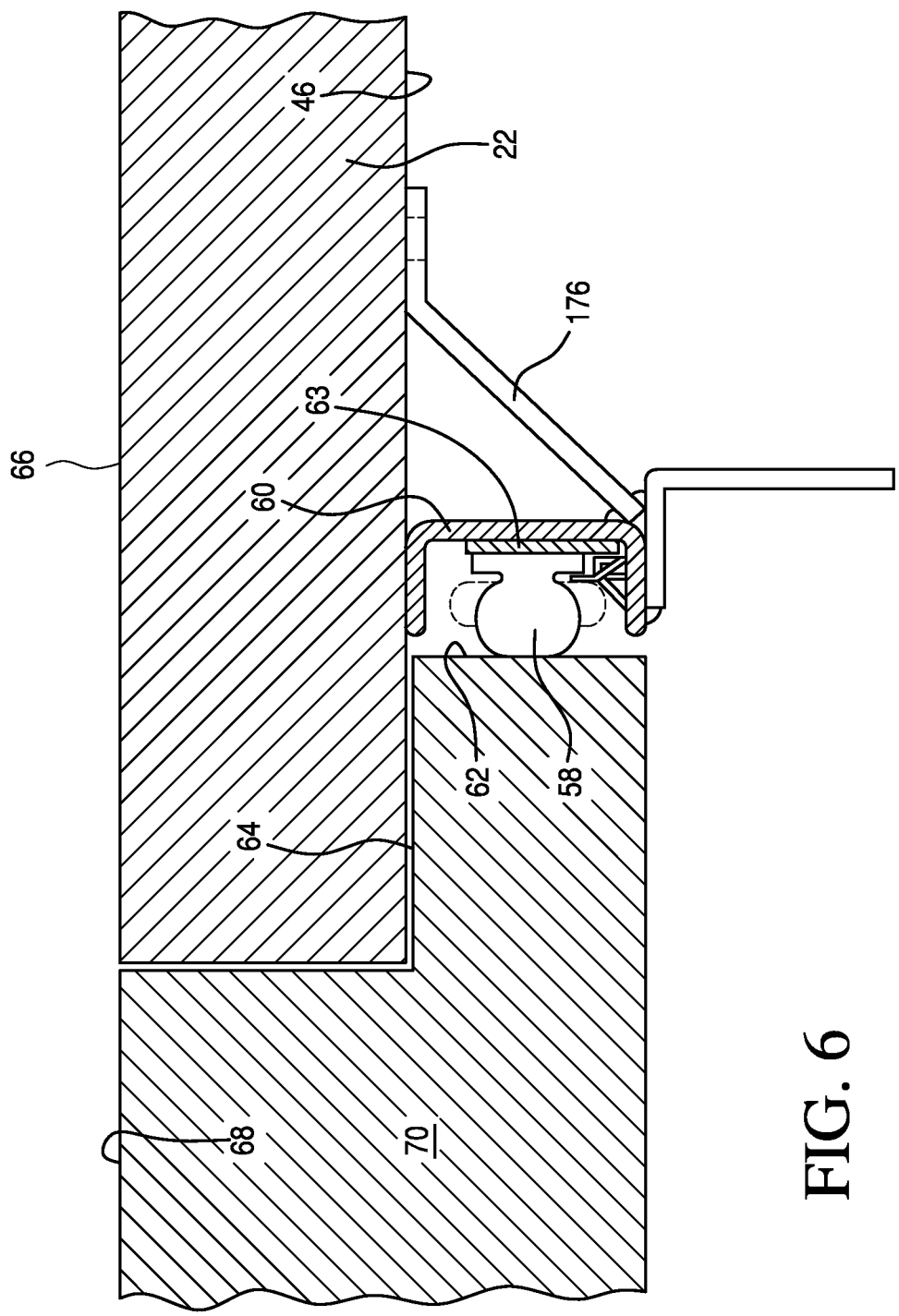
FIG. 6 is a view showing a pneumatic seal assembly intermediate a cover disposed within a collar of the enclosure housing.
Figure 10:
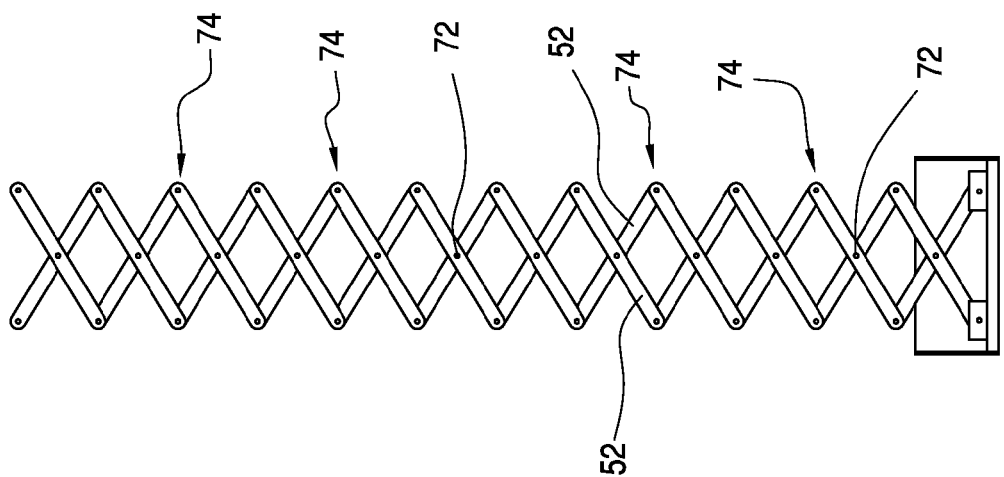
FIG. 10 is a side view of a column of the scissors lift assembly, shown in the extended position.
Figure 9:
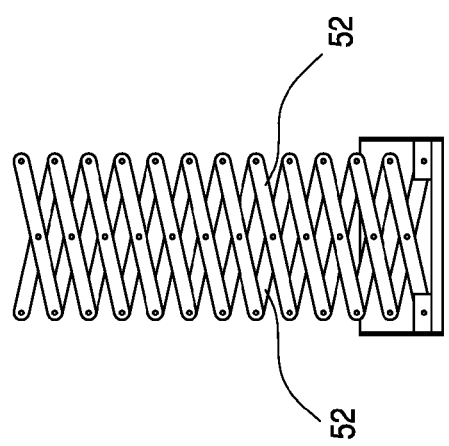
FIG. 9 is a side view of a column of the scissors lift assembly, shown in the retracted position.
Figure 11:
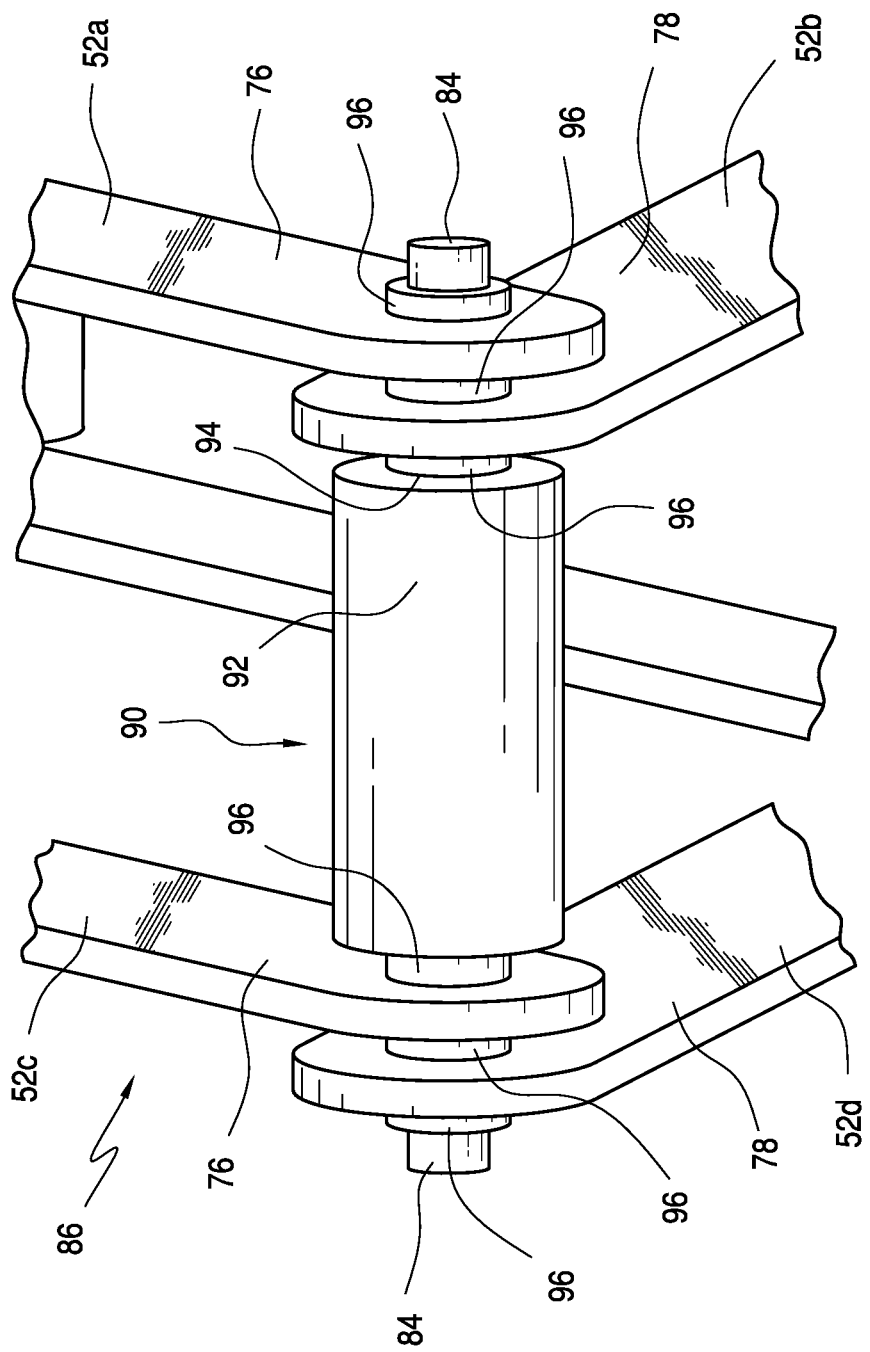
FIG. 11 is a perspective view of a spacer within a scissor linkage unit.

FIG. 5 shows a portion of a bottom surface 46 of the cover 22 fixedly secured to upper support brackets 48, 50 (shown also in FIGS. 3 and 4). Arms 80a, 80b, 80c, 80d are pivotally supported on a pivot 54 which connects the upper support brackets 48, 50 to the interconnecting arms 52 as discussed in more detail below. Also shown are apertures 56 for receiving weld nut inserts for attaching a pneumatic seal 58 along the outer periphery of the cover 22 as shown in FIG. 6. For example, stainless steel WFZ weld nuts from the Ohio Nut and Bolt Company can be employed to attach the pneumatic seal 58 to the cover 22. A satisfactory pneumatic seal is a fluoroelastomer seal marketed under the trademark Presray Pneuma-Seal®, #PRS537, produced by Pawling Corporation of Pawling, N.Y. The pneumatic seal 58 of the cover 22 can be inflated to a pressure of 25 psi. Upon inflation, the pneumatic seal 58 forms a seal against the edge 62 of the collar 70. The cover 22 is generally planar having the pneumatic seal 58 within a u-shaped channel 60 disposed on the periphery of the bottom surface 46 of the cover 22 for cooperatively aligning with an edge 62 of the collar 70 of the underground enclosure housing 12, as shown in FIGS. 6 and 7. A spacer 63, for example, a Poron® silicone material, is disposed between the channel 60 and the pneumatic seal 58. Preferably, the cover 22 is formed of a polymer concrete such as that produced by CDR Systems Corporation. In a preferred embodiment of the invention, the comcore cover 22 rests on a recessed ledge 64 of the underground enclosure housing 12 and a top surface 66 of the cover 22 lies coplanar to a top surface 68 of a collar 70 of the underground enclosure housing 12 as described in more detail below.

Turning now to FIGS. 8-13, the scissor linkage units 34 each include the interconnecting arms 52 having a centrally positioned pivot 72 and forming x-shaped arm assemblies 74. For example, in FIG. 10, twelve arm assemblies 74 are shown. The scissor linkage units 34 are positioned in a vertically stacked relation, wherein terminal ends 76, 78 of the arms 52 of one scissor linkage unit 34 are connected to the terminal ends 76, 78 of the arms 52 of another scissor linkage unit 34. As shown in FIGS. 5, 8a and 8b, a set of four shorter arms 80a, 80b, 80c, 80d are directly connected to the pivot 54 of the upper support bracket 48. These four arms 80a, 80b, 80c, 80d are generally shorter in length than the other arms in the arm assemblies. In a preferred embodiment, the four arms 80a, 80b, 80c, 80d are approximately one-half the length of the other arms 52 in the arm assemblies 74. All of the arms 52, and 80a, 80b, 80c, 80d are preferably fabricated of aluminum and are approximately 0.25 inches thick. The longer arms 52 each include three apertures 82 for receiving bolts 84 and forming pivots 72. The four shorter arms 80a, 80b, 80c, 80d each include two apertures 88 for receiving bolts 84 and forming pivots 54. As shown in the figures, and in accordance with known functionality, the scissor linkage units 34 expand and retract in unison between a retracted position and an extended position.

The scissor linkage units 34 each include the centrally positioned pivots 72 having a spacer 90 between the x-shaped arm assemblies 74. In an embodiment of the invention, the spacer 90 includes a tube 92 having a through-bore 94. Within each end of the through-bore 94 is a helicoil (not shown) arranged to receive a threaded end of the bolt 84. Preferably, the bolt 84 is a shoulder bolt having a length of approximately 6 inches and a diameter of approximately $\frac{3}{8}^{ths}$ inches. Each terminal end 76, 78 of the arms 52 include the aperture 82 for aligning and receiving the bolt 84. That is, two terminal ends 76, 78 of the arms overlap such that the apertures 82 align for purposes of receiving the bolt 84 and forming a pivot 86. Thrust bearings 96 are disposed between the bolt 84 and the adjacent arms 52a, 52d, between the overlapping arms 52a, 52b and 52c, 52d, and between the tube 92 and the arm adjacent thereto 52b, 52c.

Figure 14:
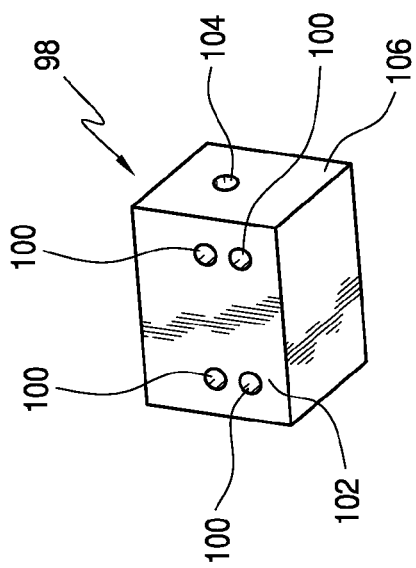
FIG. 14 is a perspective view of a bracket mount.
Figure 13:
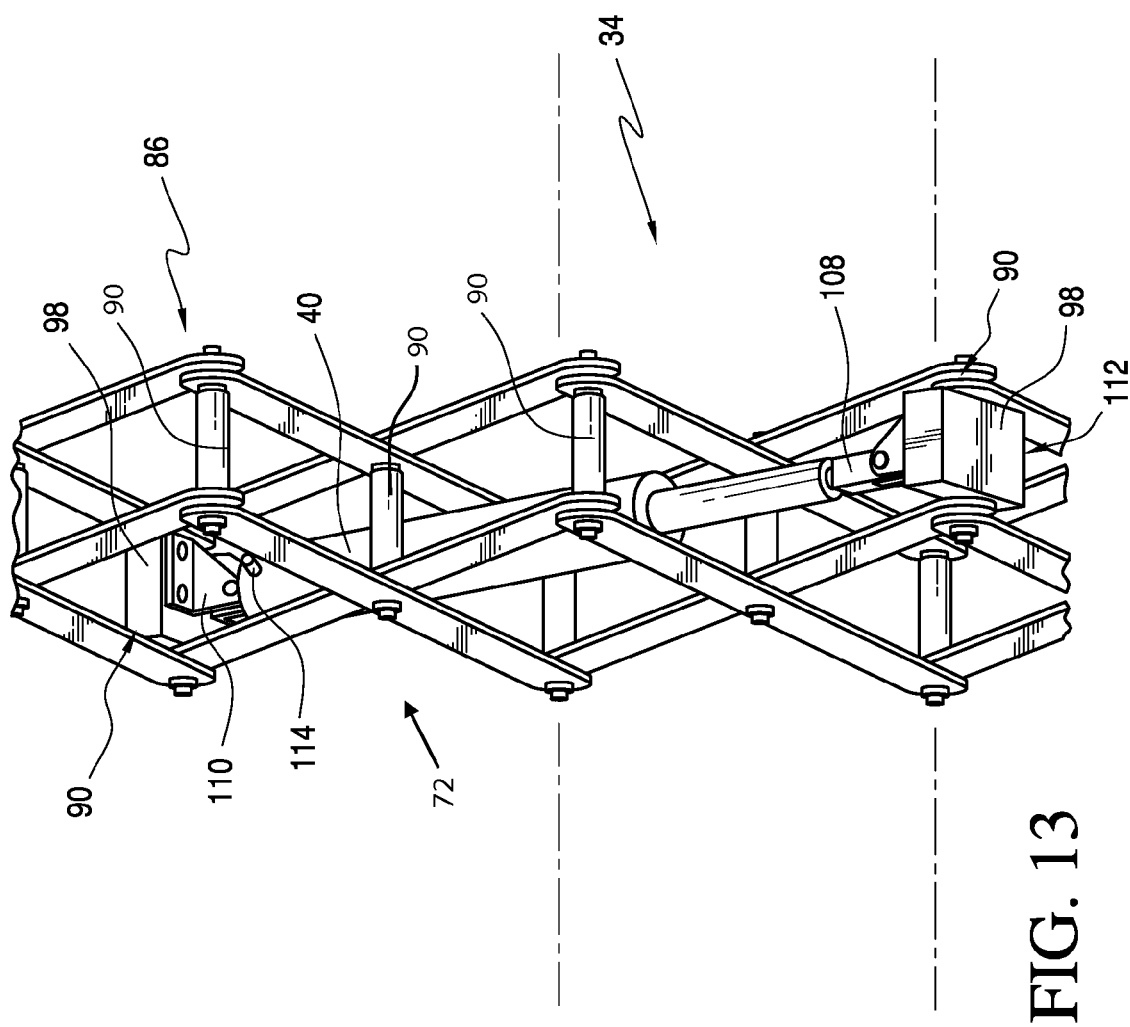
FIG. 13 is a perspective view of a portion of the scissor linkage units in the extended position, showing a pneumatic cylinder coupled to the scissors linkage units.

Another type of spacer 90 included between several of the x-shaped arm assemblies 74 is a bracket mount 98 for attaching the pneumatic cylinder assemblies 40. The bracket mount 98, as shown in FIG. 14, is preferably fabricated from T-6 aluminum, and includes apertures 100 through a top planar surface 102 of the bracket mount 98 and a through-bore 104 through a side 106 of the bracket mount 98, all having helicoils. The apertures 100 receive threaded screws to secure terminal ends 108, 110 of the pneumatic cylinder assemblies 40 and the through-bore 104 receives the bolt 84 providing a pivot joint 112. Thrust bearings 96 are disposed between the bolt 84 and the adjacent arms 52a, 52b, between the overlapping arms 52a, 52b and 52c, 52d, and between the bracket mount 98 and the arm adjacent thereto 52b, 52c. It should be appreciated by those having ordinary skill that the thrust bearings 96 permit an ease of rotation of the bracket mount 98 about the pivot joints 112.

The pneumatic cylinder assemblies 40 are fluidly connected to an external pressurized gas source via at least one inlet port line and a pneumatic line connected to a first speed connector 182 within the control box 24. In the embodiment shown in FIGS. 12 and 13, for example, the pneumatic cylinder assembly 40 includes two inlet port lines 114, 116. It should be appreciated by those having ordinary skill in the art that the inlet port lines 114, 116 are oriented perpendicular to the arms 52 of the scissor linkage units 34 preventing interference with the inlet port lines 114, 116 when the scissors lift assembly 16 is expanded and retracted.

Each column 36, 38 includes at least one pneumatic cylinder 40. Preferably, each column 36, 38 includes two pneumatic cylinders 40. These pneumatic cylinders 40 are controllable for both movement from a retracted to an extended position and movement from the extended position to the retracted position. For example, as shown in FIGS. 3 and 4, with a stroke of one inch of one of the pneumatic cylinders 40, the distance between the scissor linkage unit 34 from A to B and from C to D increases by seven inches from AA to BB and from CC to DD. The overall height of the columns 36, 38 increases when the columns 36, 38 are vertically actuated by the pneumatic cylinders 40 from the retracted position to the expanded position, from approximately fifty-two inches to approximately one-hundred inches, and more preferably to approximately one-hundred thirty inches. A satisfactory pneumatic cylinder has a diameter of 2½ inches, provides a lift of approximately 250 lbs and is commercially available from Bimba Manufacturing. Thus, providing two pneumatic cylinders 40 in each column 36, 38 provides a total of 1000 lbs of total lift. The pneumatic cylinders 40 in each column 36, 38 are preferable disposed along the same plane. For example, as shown in FIG. 4, the pneumatic cylinders 40 of the column 36 are diagonally mounted wherein the lower end is in the front, when the scissors lift assembly 16 is in the extended position, while the pneumatic cylinders 40 of the column 38 are diagonally mounted, wherein the lower end is in the back, when the scissors lift assembly 16 is in the extended position. It should be apparent by those having ordinary skill that the connected scissor linkage units 34 provide a significant mechanical advantage, and together with the pneumatic cylinder assemblies 40, which each provide a lift of 250 lbs, the scissors lift assembly 16 can lift approximately 2,500 lbs.

The rack 28 is disposed between the two columns 36, 38 to be vertically moveable from a retracted position within the housing 12 to an extend position locating at least a portion, and preferably the entire rack 28 above the housing 12. The rack 28 is connected to the columns 36, 38 and/or the cover 22, and is substantially coplanar therewith, wherein the telescoping guide tracks 42, 44 prevent the rack 28 from pivotally rotating during translation. The rack 28 includes a top panel 118, shown in FIG. 5, and bottom panel 120 (shown in FIGS. 3 and 4) disposed between and perpendicularly to the columns 36, 38 and side panels 122, 124 disposed parallel and adjacent to the columns 36, 38. Preferably, the top and bottom panels 118, 120 are approximately ¼ inch thick and fabricated of aluminum, however, other types of metals and thicknesses may be used. The front and the back of the rack 28 are open and accessible for mounting electronic equipment, components and cables. The rack 28 and the columns 36, 38 may be any of a variety of sizes.

Figure 15:
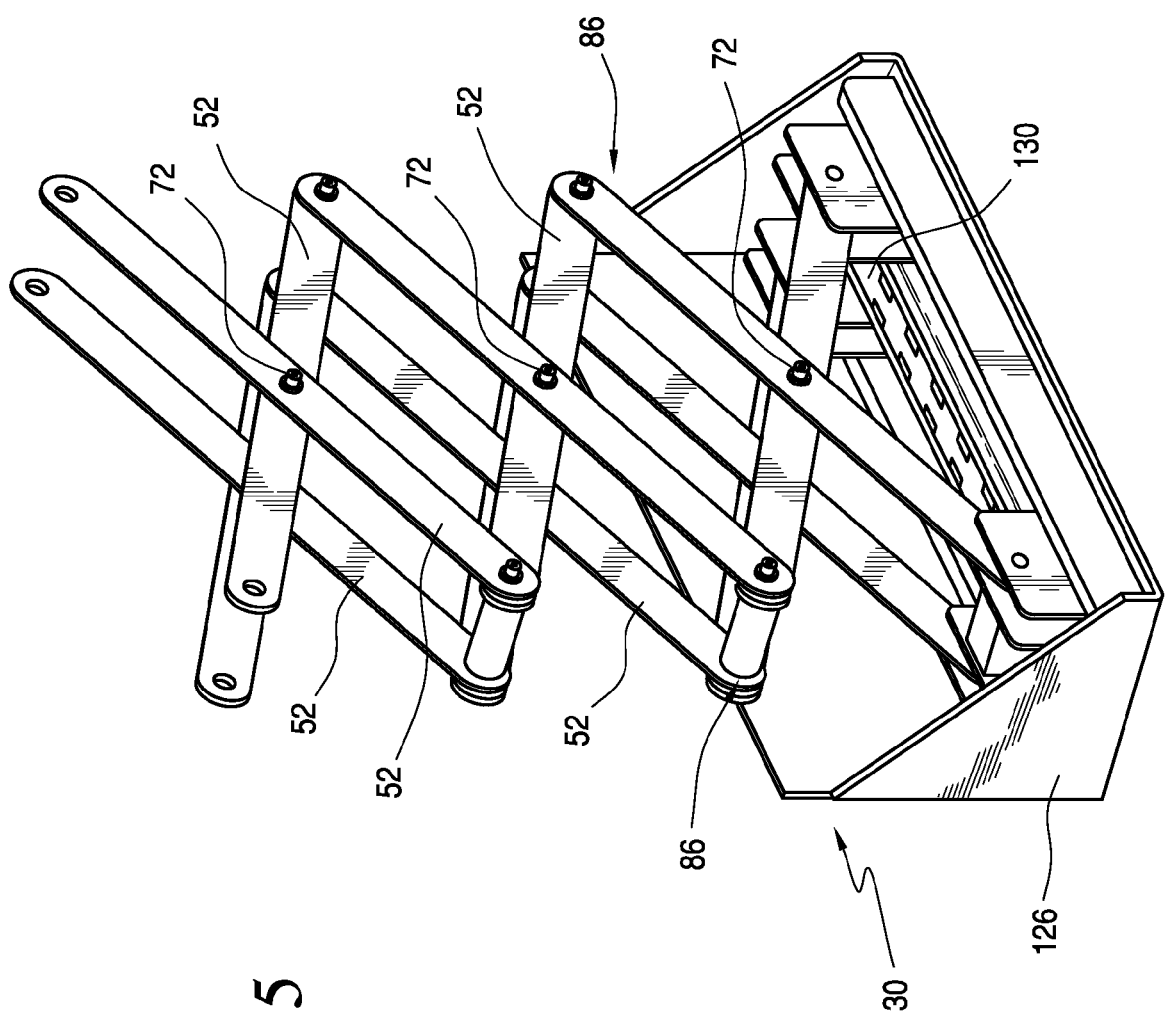
FIG. 15 is a perspective view of a base weldment and a portion of the column.
Figure 16:
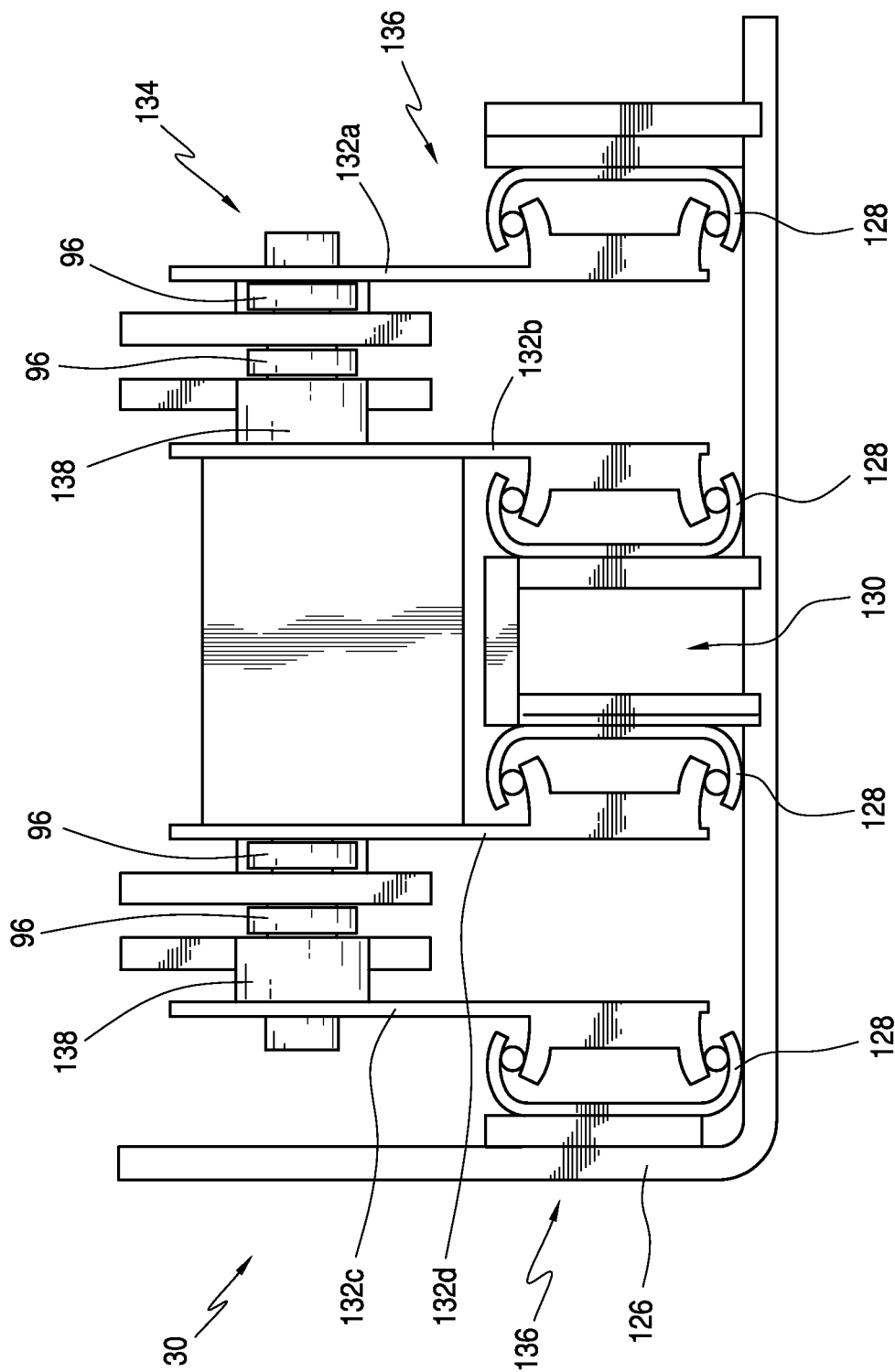
FIG. 16 is a cross-sectional view of the base weldment.
Figure 17:
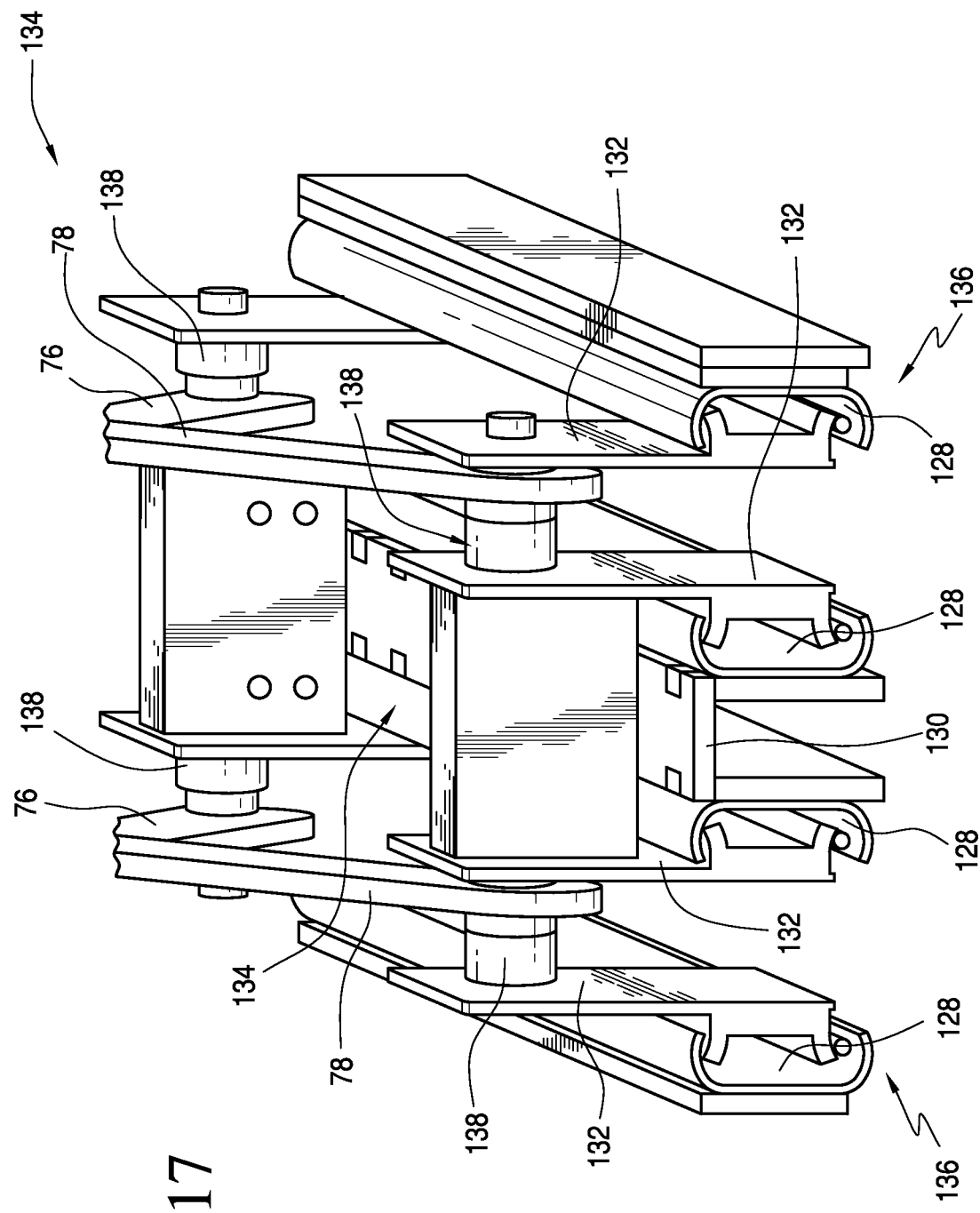
FIG. 17 is a perspective view of the base weldment without an L-shaped bracket.

As described above, the scissors lift assembly 16 includes two base weldments 30, 32 arranged to receive sets of scissor linkage units 34 forming the pair of vertically extendible columns 36, 38 controllable and vertically translated by pneumatic cylinder assemblies 40. Shown in FIGS. 15-17, the base weldments 30, 32 preferably include a bracket 126, preferably an L-shaped bracket fabricated of aluminum and approximately ¼ inch thick. Two sets of slides 128 are parallelly disposed within the bracket 126 and a center support 130 spaces apart the two sets of slides 128. The slides 128 include a track for slideably connecting plates 132 thereto. The plates 132 are disposed at each end of the slides 128 and the terminal ends 76, 78 of the lower set of arms 52 are connected to the plates 132 by pivots 134, forming sliding assemblies 136. That is, at one end of the bracket 126, four plates 132a, 132b, 132c, 132d are parallely aligned along the slides 128. A bracket mount 98 is disposed between the two inner plates 132b, 132c and bolts 84 are employed on each side of the two outer plates 132a, 132d to secure the terminal ends 76, 78 of the arms 52 between the inner plates 132b, 132c and the outer plates 132a, 132d and to secure the bracket mount 98 between the two inner plates 132b, 132c. A steel spacer 138 and thrust bearings 96 may be employed to provide proper alignment and rotation about the pivots 134. When the pneumatic cylinders 40 translate the columns 36, 38, the force on the terminal ends 76, 78 of the arms 52 translates the sliding assemblies 136 towards each other. That is, the sliding assemblies 136 are actuated from a spaced position to a proximal position. In a preferred embodiment, each sliding assembly 136 travels approximately 2 inches, providing an overall translation of 4 inches.

Figure 18:
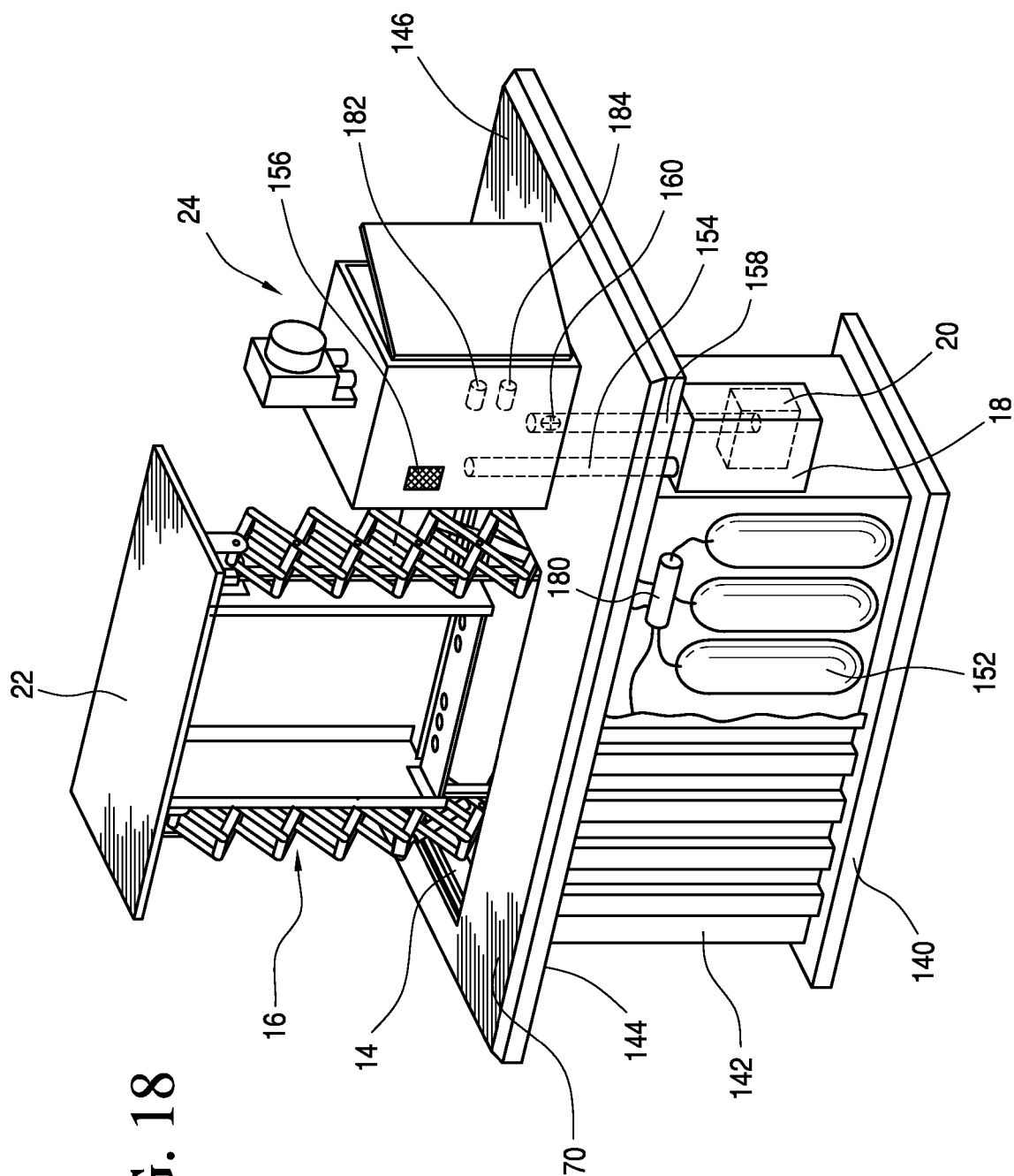
FIG. 18 is a perspective view of the underground enclosure showing a battery box and pipes therein.

Referring now to FIG. 18, the underground enclosure system also includes a base pad 140 which forms the bottom of the underground enclosure 10 and is a generally planar member having an upper surface for cooperatively engaging walls 142. The base pad 140 is formed of a polymer concrete such as that produced by CDR Systems Corporation. The walls 142 are secured to the base pad 140 providing a rectangular enclosure and are preferably formed of fiberglass. The collar 70 is formed perpendicular to the walls 142 and is a generally planar member having a lower surface 144 generally co-planar with a ground surface. Alternatively, an upper surface 146 of the collar 70 is generally co-planar with the ground surface. Thus, together the base pad 140, walls 142, and collar 70 form the housing 12 of the underground enclosure 10 having the interior region 14. A section of the collar 70 is removable, forming the cover 22 as described above. Positioned on the upper surface 146 of the collar 70 is a control housing 26 having an electric meter and a 220/240 volt 100 Amp sleeve. The control housing 26 includes side access doors 148 and an emergency pin and sleeve device 150. A satisfactory emergency pin and sleeve device can be purchased from the Hubbell Corporation. The emergency pin and sleeve device 150 is used for connecting a generation device of 220/240 Volts-100 Amps to the control box 24 for charging the batteries during a power outage.

Preferably, the underground enclosure 10 is pressurized by a pneumatic system including an internal pressurized gas source 152 and an external pressurized gas source. The pneumatic system also includes a first stage and second stage pressure regulator 180, a venting manifold, and associated lines and valving.

In one configuration, the internal pressurized gas source 152 is employed to pressurize the interior region 14 of the underground enclosure 10, to actuate the locking assemblies 162, to inflate the pneumatic seal 58, and to maintain the pressure within the enclosure 10 and within the pneumatic seal 58 when the enclosure 10 is closed. That is, the pressurized gas source 152 is selectively connected to the interior 14 of the enclosure 10 as well as the pneumatic seal 58 and the locking assemblies 162. The pressurized gas source 152 in one configuration includes three tanks fluidly connected to the enclosure 10, the pneumatic seal 58 and the locking assemblies 162. The three tanks, in one configuration, are approximately 144 cubic feet and pressurized with air at approximately 2,250 psi. Preferably, the pressurized gas source 152 maintains a pressure of approximately 2.5 psi within the underground enclosure 10 and approximately 25 psi within the inflated pneumatic seal 58.

Figure 12:
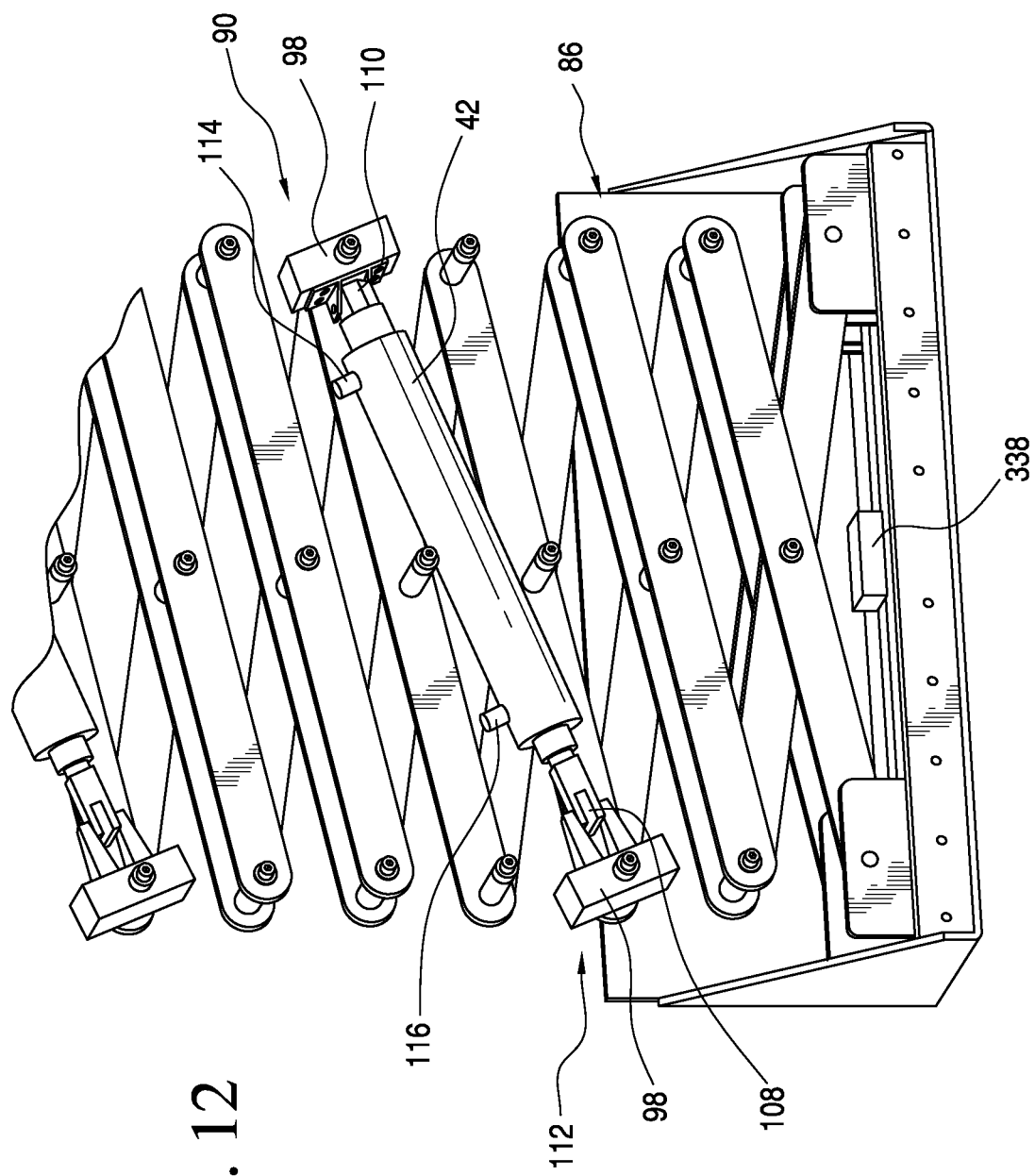
FIG. 12 is a perspective view of a portion of the column in the retracted position, showing a pneumatic cylinder therein.

As discussed above, movement of the scissors lift assembly 16 from the retracted position to the extended position and movement from the extended position to the retracted position are controlled pneumatically through the pneumatic cylinder assemblies 40 connected to the external pressurized air source. As shown in FIGS. 5 and 12, limit switches 342 and 338, detect whether the rack 28 is in the extended position or retracted position, respectively. It should be appreciated by those having ordinary skill in the art that using the external pressurized gas source to actuate the scissors lift 16 prevents the fast depletion of the internal pressured gas source 152 contained within the enclosure 10.

The first and second stage regulator 180 may be, a 412 Series Regulator such as that produced by CONCOA®. In one configuration, the regulator 180 includes seven ports, with one of the ports having a pneumatic line connected to a safety valve 184 within the control box 24. Thus, should a diaphragm seal of the regulator rupture, the pressurized air source 152 will bleed off into the ambient atmosphere.

The battery box 18 within the sealed underground enclosure 10 generally contains a chargeable battery 20, and is preferably vented to prevent an accumulation of gas produced by the battery 20. That is, chargeable batteries can produce Hydrogen gas ($H_2$) when being charged, which accumulates in the battery box 18 if not vented. Thus, a venting pipe 154 is fluidly connected to from the top of the battery box 18 to the ambient air via the control box 24 having a louver. A vacuum generator 156, for example, a fan, is located within the control box 24 to reduce the pressure in the battery box 18 and expel the gas produced by the battery 20. Since Hydrogen gas ($H_2$) is lighter than air, the Hydrogen gas ($H_2$) rises to the top of the battery box 18, through the venting pipe 154 coupled to the control box 18 and, thus to the ambient atmosphere. The vacuum fan can operate at 110V, or 48V in an emergency. A second venting pipe 158 is also fluidly connected to the battery box 18 and to the ambient air. In one configuration, the first end of the venting pipe 158 is disposed through the control box 24, wherein the venting pipe 154 extends approximately six inches into the control box 24 and the second end of the venting pipe 158 is disposed approximately half way into the battery box 18.

Reducing the pressure of gas within the battery box 18 via the fan 156 in the first venting pipe 154 permits ambient air to flow from the ambient atmosphere to the battery box 18 through the second venting pipe 158. A one-way valve 160, such as a commercially available check valve precludes gas flow from the battery box 18 to the ambient air.

As shown in FIG. 7, a plurality of locking assemblies 162 are employed to releasably retain the cover 22. In a preferred embodiment, the enclosure 10 includes at least four locking assemblies 162. Each locking assembly 162 includes a pneumatic cylinder 164 which releases a piston 166 when the locking assembly 162 is engaged. The locking assemblies 162 are fluidly connected to the internal pressurized gas source 152 and to the collar 70 of the underground enclosure 10 by bracket 168, wherein the bracket 168 is an L-shaped bracket having a first end bolted to a bottom surface of the collar 70 and a second end for receiving a piston end 172 of the pneumatic cylinder 164. In the locked position, the piston 166 extends through the aperture in an L-shaped bracket 168, which is connected to the cover 22 via an angle bracket 176 extending diagonally from the cover 22 to the channel 60 supporting the pneumatic seal 58 of the cover 22. Preferably, the angle bracket 176 is bolted to the cover 22 at one end and welded to the L-shaped bracket 168 and the channel 60 at the other end. Thus, to engage (lock) the locking assembly 162, pressurized air flows from the internal pressurized gas source 152 through pneumatic lines to the pneumatic cylinders 164 causing the piston 166 to translate from a retracted position to an engaged position, wherein the piston 166 extends though the bracket 168. To disengage (unlock) the locking assembly 162, pressurized air flow from the internal pressurized gas source 152 is stopped and the piston 166 reverts to the retracted position. As shown in FIG. 7, limit switch 346 detects the position of the piston 166. The limit switches are described in more detail below.

In use, a hole is formed in the ground and the base pad 140 and walls 142 are disposed in the hole such that a collar 70 is substantially co-planar with the surrounding ground surface. Cables are introduced through corresponding ports in the walls 142 and are sealed by means well known in the art. To keep the telecommunication cables, electric wires and air lines organized during the raising and lowering of the rack 28, an energy chain system sold under the trademark Igus® E-chain® is employed within the enclosure 10.

Figure 19:
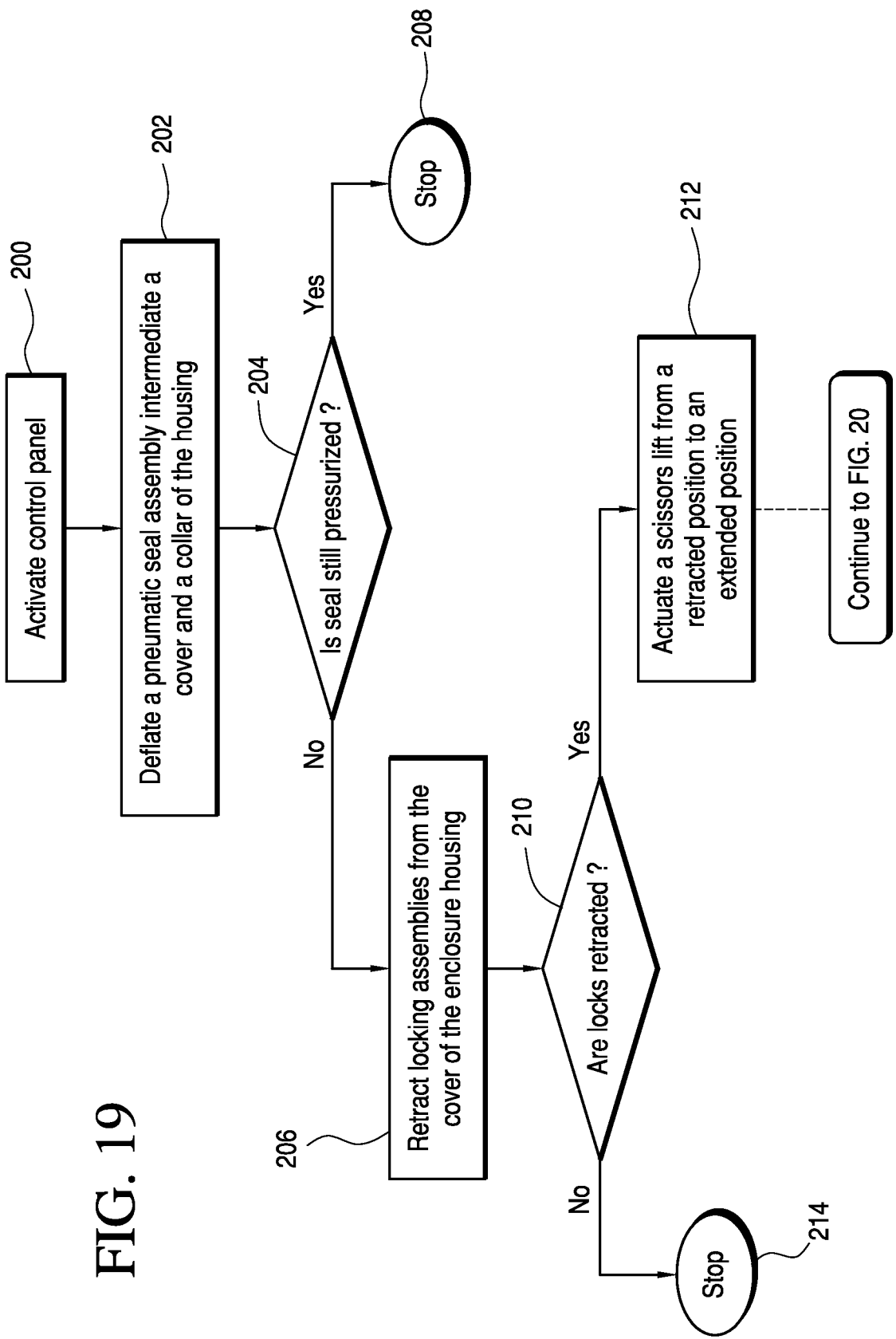
FIG. 19 is a flow diagram depicting an embodiment of a method of opening the underground enclosure.
Figure 20:
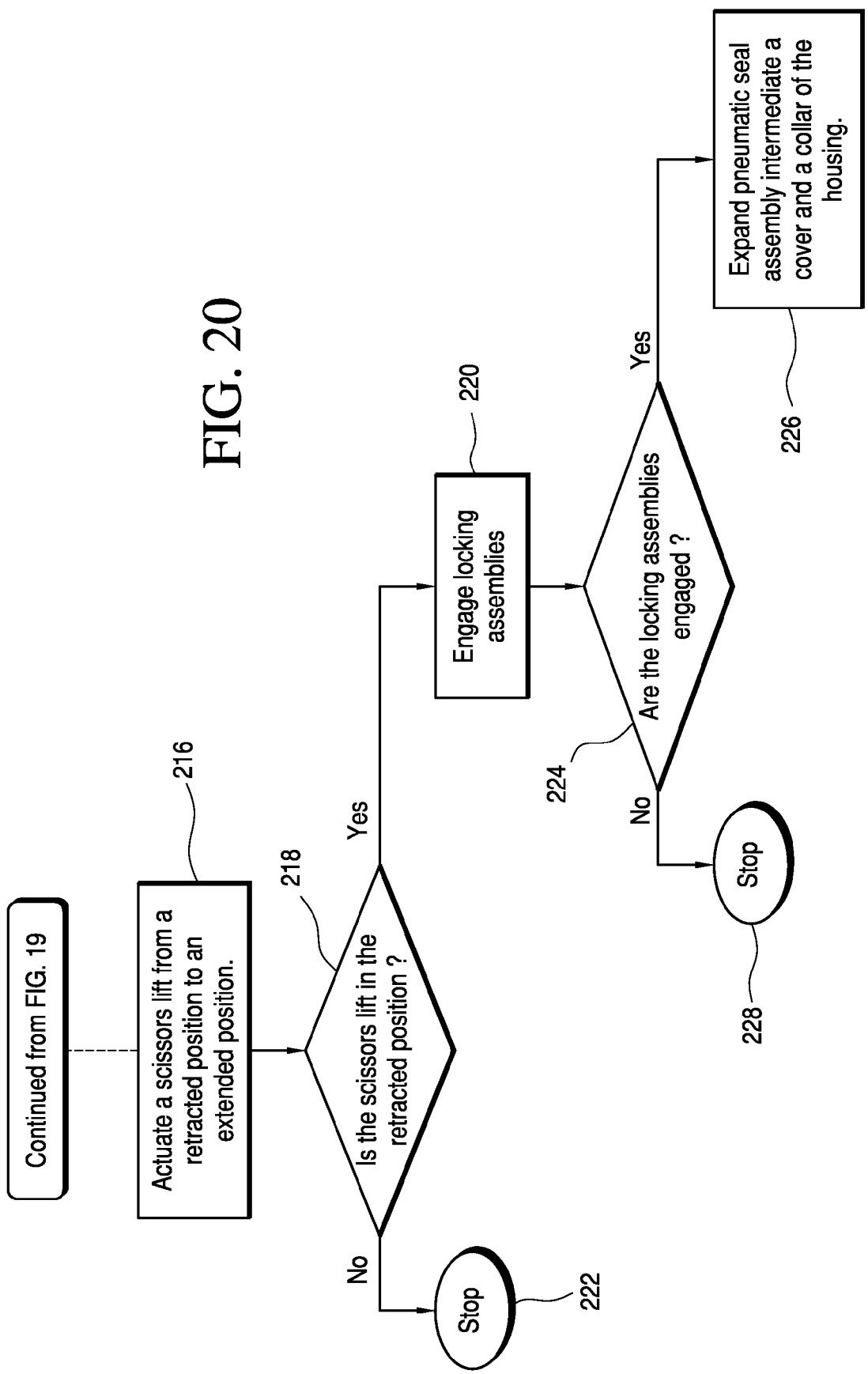
FIG. 20 is a flow diagram depicting an embodiment of a method of closing the underground enclosure.

Referring to FIGS. 19 and 20, an embodiment of a method of opening the pressurized underground enclosure is depicted. Generally, a series of Allen Bradley switches are connected to a MAC solenoid pilot, which operates valves to control the operation of opening the underground enclosure 10. More specifically, to open the pressurized enclosure 10, one operates the control panel within a housing 26, for example a pendant, according to step 200, by turning a key switch to an "on" position to stop the internal pressurization of the interior 14 of the enclosure 10 by discontinuing the flow of gas through a supply line connecting the pressurized gas source 152 to the enclosure 10. The pneumatic seal assembly 58 intermediate the cover 22 and the collar 70 of the enclosure 10 is deflated, shown in step 202, by discontinuing any flow of gas through a supply line connecting the internal pressurized gas source 152 to the enclosure 10. If pressure is no longer detected in the pneumatic seal 58, as depicted in reference number 204, an indicator light illuminates and the sequence continues. However, if pressure is detected in the pneumatic seal 58, then the sequence is not allowed to continue. The pressurized air within the underground enclosure 10 dissipates through a small gap that forms between the deflated pneumatic seal 58 and the collar 70. Once the pneumatic seal 58 is deflated, the locking assemblies 162 are retracted from the cover of the enclosure housing 12, as depicted in reference number 206. The indicator lights will now show that the seal 58 is collapsed, the lock assemblies 162 are retracted and the rack 28 is in the retracted position. According to step 210, if the lock assemblies 162 are successfully retracted, then the rack 28 is permitted to actuate from the retracted position to the extended position wherein the rack 28 extends through the opening created by removing the cover 22 from the underground enclosure 10. That is, the cover 22 is attached to the upper support brackets 48, 50 and therefore, is lifted from the enclosure 10 when the rack 28 is translated, protecting the equipment secured to the rack 28 from weather and other elements. An indicator light is illuminated indicating that the rack 28 is in the extended position.

It should be appreciated by those having skill in the art that the cables are cooperatively engaged with the rack 28 and sufficient slack is disposed between the rack 28 and the interior 14 of the housing 12 to permit the scissors lift assembly 16 to be translated from the retracted position to the extended position. As the volume of the enclosure 10 is usually insufficient to accommodate the scissors lift assembly 16 and an operator, the pneumatic cylinder assemblies 40 are actuated with an external pressure source and the rack 28 is disposed outside the housing 12. Ample access is thus provided for the operator to work on the rack 28 having the cables and any equipment.

As indicated in step 216, the rack 28 is then lowered into the enclosure 10 as the columns 36, 38 are compressed, and an indicator light shows that the rack 28 has been lowered. If the rack 28 is not completely lowered, according to step 218, then the sequence is not permitted to continue according to step 222. However, if the rack 28 has been successfully retracted, then the locking assemblies 162 are engaged as shown in step 220. The cover 22 being connected to the rack 28, is lowered with the rack 28 onto the recessed ledge 64 wherein the seal 58 and edge 62 of the collar 70 align and the top of the cover 22 is flush with the top of the collar 70. Finally, as shown in step 224, if the locking assemblies successfully engage, the pneumatic seal 58 is inflated by the internal pressurized gas source 152 according to step 226. If the locking assemblies have not successfully engaged, the pneumatic seal 58 is not inflated. The locking assemblies 162 are actuated to secure the cover 22 relative to the collar 70. Once the locking assemblies 162 are actuated, the enclosure 10 is pressurized to 2.5 psi and the pneumatic seal 58 of the cover 22 is pressurized to 25 psi. Preferably, there are no leaks for the pressurized gas in the enclosure 10 that bleed pressure to the ambient atmosphere.

Figure 21:
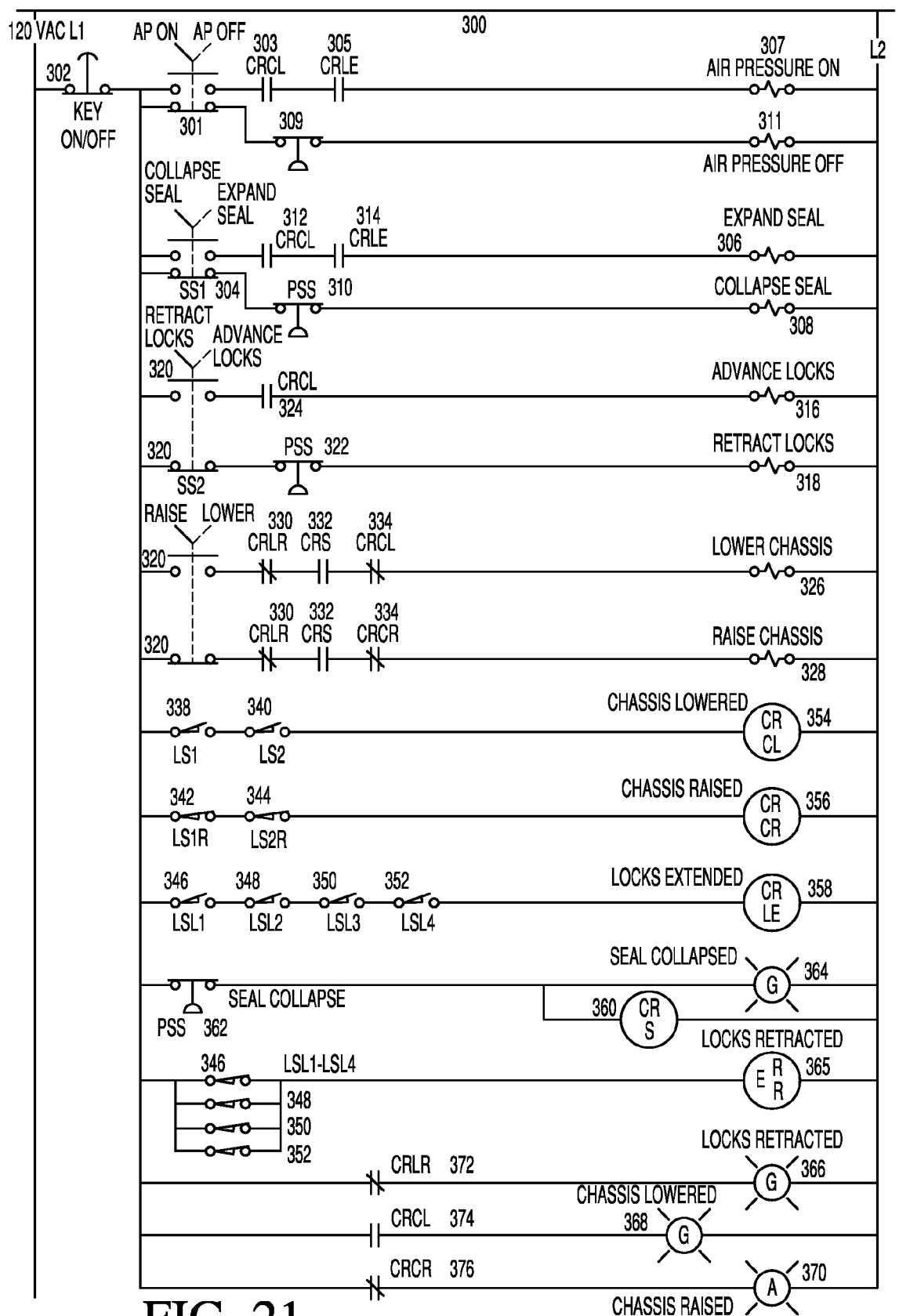
FIG. 21 is a schematic view depicting the electromechanical operation of the underground enclosure.

FIG. 21 is a schematic diagram of an exemplary control circuit 300 for controlling the operation of the various components of an exemplary embodiment of the invention. The control circuit 300 shown in FIG. 21 controls the operation of the various actuators and indicators that make up the invention as will be described in more detail below.

While the control circuit 300 of FIG. 21 contemplates a standard 120 volt AC power source, it will be appreciated by those skilled in the art that other arrangements that function in substantially the same way may also be employed using either higher or lower voltages, AC or DC, logic levels or the like, as long as the function or functions provided by the circuit of FIG. 21 are carried out. As shown in FIG. 21, two phases L1 and L2 of a 120 volt circuit are provided. The control circuit 300 is connected between the two phases. A key lock 302 turns the entire control circuit 300 on and off. It is conceivable that some portions of the control circuit 300 such as indicator lights might be left on continuously if desired.

A first switch 301 is connected to the on/off key lock switch 302 and has two positions, an air pressure on position and an air pressure off position and controls the operation of two controllers 307, 311, for turning the internal pressurized gas source 152 on and off, respectively. When the switch 301 is in the air pressure on position, the pressure on controller 307 is coupled through first and second contacts labeled CRCL (Control Relay Chassis Lowered) 303 and CRLE (Control Relay Locks Extended) 305 the activation of which is described in more detail below. If both of these sets of contacts 303, 305 are closed, the air pressure on controller 307 is energized and the internal pressurized gas source 152 pressurizes the system. If the switch 301 is in the opposite air off position, power flows through a pressure sensor switch (PSS) 309 and if the pressure sensed by the switch 309 is below a predetermined threshold the air pressure controller 311 is activated to turn off the air pressure from the internal pressurized gas source 152.

A second switch (SS1) 304 has two positions, collapse seal and expand seal and controls the operation of two controllers 306 and 308 for pneumatically expanding and collapsing the pneumatic seal 58, respectively. As shown in FIG. 21, when switch (SS1) 304 is in the collapsed seal position, power flows through a pressure sensor switch (PSS) 310 and if the pressure sensed by the switch 310 is below a predetermined threshold the collapsed seal controller 308 is activated to deflate the seal 58. If the switch 310 is in the opposite expand seal position, the expand seal controller 306 is coupled through first and second contacts labeled CRCL (Control Relay Chassis Lowered) 312 and CRLE (Control Relay Locks Extended) 314 the activation of which is described in more detail below. If both of these sets of contacts 312, 314 are closed, the expand seal controller 306 is energized and the seal 58 is inflated.

The operation of first and second lock actuators will be described next. The first lock actuator 316 advances the locks 162, also referred to herein as locking assemblies, and the second lock actuator 318 retracts the locks 162. A switch (SS2) 320 has two positions, retract locks and advance locks. When the switch 320 is in the retract locks position, power is supplied through the switch (PSS) 322 and the retract locks actuator 318 is energized. When the switch 322 is in the opposite advance locks position and contactor CRCL (Control Relay Chassis Lowered) 324 is closed the advance locks actuator 316 is energized. Pressure sensor (PSS) 322 senses pressure in the seal 58 and only permits the locks 162 to be retracted when the pressure is low.

The next circuits control the raising and lowering of the chassis 28, also referred to herein as the rack, by controlling the lower chassis actuator 326 and the raised chassis actuator 328 respectively. Switch (SS2) 320 has two positions, raise and lower. When the switch 320 is in the raise position, power is applied through the switch 320 and through three sets of contacts; CRLR (Control Relay Locks Retracted) 330, CRS (Control Relay Seal Collapsed) 332 and CRCR (Control Relay Chassis Raised) 334. Note that contacts CRLR 330 and CRCR 334 are normally closed while contact CRS 332 is normally opened. Thus, when the switch 320 is in the raised position, the raise chassis actuator 328 is energized when the locks 162 are retracted, the seal 58 is collapsed, and the chassis 28 is not yet raised.

Similarly, when switch (SS2) 320 is in the chassis lower position, power is applied through contact CRLR (Control Relay Locks Retracted) 330, CRS (Control Relay Seal Collapsed) 332, and CRCL (Control Relay Chassis Lowered) 336. Contacts CRLR 330 and CRCL 336 are normally closed, while contact CRS 332 is normally open. Thus, when the switch 320 is in the chassis lower position the lower chassis actuator 326 is energized when the locks 162 are retracted, the seal 58 is not pressurized, and the chassis 28 is not in the lowered position.

The next three circuits control the chassis lowered, chassis raised, and locks extended relays. The positions of the limits are shown in FIG. 21.

The chassis lowered contactor 354 is energized when Limit Switch (LS1) 338 and Limit Switch (LS2) 340 are both closed indicating that the chassis 28 is securely in the lowered position. The chassis raised contactor 356 is energized when normally open Limit Switches (LS1R) and (LS2R), 342 and 344, respectively, are in the closed position indicating that the chassis 28 is fully raised.

The locks extended contactor 358 is energized when all four Limit Switches LSL1, LSL2, LSL3, and LSL4 (346, 348, 350, 352), are all closed. One of these Limit Switches is associated with each lock 162.

The CRS (Control Relay Seal Collapsed) contactor 360 is activated when pressure sensor switch (PSS) 362 indicates a low pressure. As can be seen, a seal collapsed indicator light G 364 is connected in parallel with actuator CRS 360 to provide a visible indication that the seal 58 is collapsed.

The Control Relay Locks Retracted (CRLR) contactor 365 is controlled by the four limits, which is LSL1-LSL4, 346, 348, 350, 352 connected in parallel. The lock retracted contactor 365 is energized only when none of the limit switches 346, 348, 350, 352 indicate that a lock 162 is extended. Thus, the activation of the lock retracted contactor 365 indicates that all of the locks 162 are retracted.

Finally, three indicator lights 366, 368, 370 are provided. A first locks retracted indicator light 366 is controlled by a set of normally closed contacts (CRLR) 372. A chassis lowered indicator light 368 is controlled by a set of normally open contacts CRCL (Control Relay Chassis Lowered) 374 and a chassis raised indicator light 370 is controlled by normally opened contacts CRCR (Control Relay Chassis Raised) 376.

As mentioned above, while these functions are provided in accordance with one embodiment of the invention by the contactors relays pressure sensors and the like described above, those skilled in the art will recognize that other control systems may be used including solid state logic, microprocessor control systems and the like. The functions just described can be duplicated by a variety of such systems.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes that come within the meaning and range of equivalency of the claims are therefore intended to be embraced therein.

The invention claimed is:

1. An underground system comprising:
an underground enclosure having a floor and walls defining an opening;
a cover for the opening in the underground enclosure;
a seal intermediate the cover and the underground enclosure, the seal and the cover configured to selectively occlude the opening;
a first scissors lift and a second scissors lift, each scissors lift moveble between a retracted position and an extended position, wherein the first scissors lift is spaced apart from the second scissors lift;
a rack having a first and a second sidewall and a bottom panel extending between the first sidewall and the second sidewall, the rack positioned beneath the cover, the first sidewall adjacent the first scissors lift and the second sidewall adjacent the second scissors lift, and the cover coupling the first sidewall relative to the first scissors lift and the second sidewall relative to the second scissors lift, each of the first and the second scissors lift having:
a first plurality of scissor linkage units and an opposed second plurality of scissor linkage units, each scissor linkage unit having a pivot interconnecting arms of the scissor linkage units at a central position of a respective arm and terminal ends pivotally coupling one of the scissor linkage units to another one of the scissor linkage units, wherein one of the plurality of linkage units is slideably coupled to a base, the first plurality of scissor linkage units and the second plurality of scissor linkage units separated by a given distance; and,
a scissors lift moving piston having a first end coupled to one of the scissor linkage units and a second end coupled to another one of the scissor linkage units, wherein the scissors lift moving piston translates the scissors lift between the retracted position and the extended position and the scissors lift moving piston is located within the given distance.

2. The underground system of claim 1, wherein the scissors lift moving piston is an air cylinder for selectively disposing the scissor lift between the retracted position and the extended position.

3. The underground system of claim 2, wherein the air cylinder disposes the scissors lift at least twenty-inches per one-inch stroke of the air cylinder.

4. The underground system of claim 2, wherein the air cylinder includes at least one air inlet port line disposed perpendicularly to the scissor linkage units.

5. The underground system of claim 2, wherein the air cylinder is coupled to an external pressurized gas source.

6. The underground system of claim 1, wherein each of the pivots interconnecting arms of the scissor linkage units further comprise a spacer positioned between the arms, wherein a plurality of thrust bearings separates the arms from each other and from the spacer, and wherein the arms include aligning apertures for receiving a retaining bolt.

7. The underground system of claim 6, wherein the spacer is a tube having a center through-bore.

8. The underground system of claim 1, further comprising guide tracks adjacent the plurality of scissor linkage units, the guide tracks arranged to expand when the scissors lift moving piston translates the scissors lift between the retracted position and the extended position.

9. A scissors lift assembly for an underground enclosure system, the assembly comprising:
a rack positioned between a first and second scissors lift, each scissors lift having:
a first plurality of scissor linkeage units and a second plurality of scissor linkage units, each scissor linkeage unit having a pivot interconnecting arms of the scissor linkeage units at a central position and terminal ends pivotally coupling one of the scissor linkeage units to another one of the scissor linkeage units, wherein one of the plurality of linkage units is slideably coupled to a base, wherein the first plurality of scissor linkeage units and the second plurality of scissor linkeage units can extend parallel one another, and,
a scissors lift moving piston having a first end coupled to one of the scissor linkage units and a second end coupled to another one of the scissor linkage units, wherein the scissors lift moving piston translates the scissors lift between a retracted position and an extended position, and a cover for an opening in the underground enclosure, the cover including an inflatable pneumatic seal and a bracket to accept a locking piston of a locking assembly, and wherein the cover is moveable upon release of the inflatable pneumatic seal and translation of the locking piston of the locking assembly into a retracted piston position.

10. The scissors lift assembly of claim 9, wherein the scissors lift height is approximately fifty-two inches in the retracted position.

11. The scissors lift assembly of claim 9, wherein the scissors lift height is approximately one-hundred thirty inches in the extended position.

12. The scissors lift assembly of claim 9, further comprising a regulator fluidly coupled to an internal pressurized gas source and a safety valve within a control box, the safety valve disposed to release excess air released from the internal pressurized gas source.

13. An underground system comprising:
an underground enclosure having a floor and walls defining an opening;
a cover for the opening in the underground enclosure;
a first scissors lift and a second scissors lift, wherein the first scissors lift is spaced apart from the second scissors lift;
a rack having a first and a second sidewall and a bottom panel, the rack positioned beneath the cover, the first sidewall adjacent the first scissors lift and the second sidewall adjacent the second scissors lift, and the cover coupling the first sidewall relative to the first scissors lift and the second sidewall relative to the second scissors lift, each of the first and the second scissors lift having:
a first plurality of scissor linkage units and an opposing second plurality of scissor linkeage units, each scissor linkeage unit having a pivot interconnecting arms of the scissor linkeage units at a central position of a respective arm and terminal ends pivotally coupling one of the scissor linkeage units to another one of the scissor linkage units, wherein one of the plurality of linkage units is slideably coupled to a base, and,
spacers at the terminal ends of the scissor linkage units, the spacers located between the terminal ends of the first plurality of scissor linkage units and the terminal ends of the second plurality of scissor linkage units, a first spacer including a first mount located between one terminal end in a first linkage unit in the first plurality of scissor linkage units and an opposed terminal end in a first linkage unit in the second plurality of scissor linkage units, the mount coupled to a first end of a scissors lift moving piston, a second spacer including a second mount located between one terminal end in a second linkage unit in the first plurality of scissor linkage units and an opposed terminal end in a second linkage unit in the second plurality of scissor linkage units, the second mount coupled to a second end of a scissors lift moving piston, wherein the scissors lift moving piston translates the scissors lift between a retracted position and an extended position, and wherein the spacers separate the terminal ends of the first plurality of scissor linkage units and the terminal ends of the second plurality of scissor linkage units a distance to locate the scissors lift moving piston between the first plurality of scissor linkage units and the second plurality of scissor linkage units.

14. The underground system of claim 13, wherein the mount pivotally rotates when the scissors lift moving piston translates the scissors lift between the retracted position and the extended position.

15. A scissors lift assembly for an underground enclosure system, the assembly comprising:
a rack positioned between a first and second scissors lift, each scissors lift having:
a plurality of scissor linkage units, each scissor linkage unit having a pivot interconnecting arms of the scissor linkage units at a central position of a respective arm and terminal ends pivotally coupling one of the scissor linkage units to another one of the scissor linkage units, wherein one of the plurality of linkage units is slideably coupled to a based, and,
a scissors lift moving piston having a first end coupled to one of the scissor linkage units and a second end coupled to another one of the scissor linkage units, wherein the scissors lift moving piston translates the scissors lift between a retracted position and an extended position;
a cover for an opening in the underground enclosure, the cover including an inflatable pneumatic seal and a bracket to accept a locking piston of a locking assembly, and wherein the cover is moveable upon release of the inflatable pneumatic seal and translation of the locking piston of the locking assembly into a retracted piston position;
a locking assembly; and
an air cylinder, wherein the locking assembly is coupled to an air cylinder, and the air cylinder selectively disposes the locking assembly into an engaged position.

* * * * *